US010044124B2

(12) United States Patent
Sagano et al.

(10) Patent No.: US 10,044,124 B2
(45) Date of Patent: Aug. 7, 2018

(54) CONTACT TERMINAL AND IC SOCKET INCLUDING THE SAME

(71) Applicant: YAMAICHI ELECTRONICS CO., LTD., Tokyo (JP)

(72) Inventors: Hideki Sagano, Kawasaki (JP); Hideki Sato, Chiba (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 15/432,072

(22) Filed: Feb. 14, 2017

(65) Prior Publication Data

US 2017/0250484 A1 Aug. 31, 2017

(30) Foreign Application Priority Data

Feb. 25, 2016 (JP) ................. 2016-034757

(51) Int. Cl.
*H01R 13/193* (2006.01)
*H01R 12/89* (2011.01)
(Continued)

(52) U.S. Cl.
CPC .......... *H01R 12/89* (2013.01); *G01R 1/0466* (2013.01); *H01L 23/32* (2013.01); *H01L 24/14* (2013.01); *H01L 24/72* (2013.01); *H01R 13/2464* (2013.01); *H01R 13/2485* (2013.01); *H01R 13/2492* (2013.01); *H05K 7/1069* (2013.01); *H01L 2224/13014* (2013.01);
(Continued)

(58) Field of Classification Search
CPC ............ H01R 12/714; H01R 13/193; H01R 13/2485; H01R 2201/20; H01R 11/22; H01R 12/88; H01R 13/2428; H01R 13/6315; H01R 4/024; H01R 12/51; H01R 13/11; H01R 24/10; H01R 24/00; H01R 13/64; H01R 22/06
USPC ................ 439/263, 264, 268, 857, 70, 71
See application file for complete search history.

(56) References Cited

U.S. PATENT DOCUMENTS 6,139,348 A * 10/2000 Fukunaga .............. H01R 4/024
439/264
6,149,449 A * 11/2000 Abe ....................... H01R 12/88
439/266

(Continued)

FOREIGN PATENT DOCUMENTS

JP 2000-009752 A 1/2000
JP 2003123925 A * 4/2003 ............. H01R 33/76

(Continued)

OTHER PUBLICATIONS

English Translation of JP 2003123925.*

*Primary Examiner* — Michael A Lyons
*Assistant Examiner* — Matthew T Dzierzynski
(74) *Attorney, Agent, or Firm* — Oliff PLC

(57) ABSTRACT

In a contact terminal, a first touch portion and a second touch portion of a movable piece and a first touch portion and a second touch portion of a movable piece bite into and thus pinch a spherical surface of a bump of a semiconductor device. In this state, when an electrode surface of the semiconductor device is warped upward during a test and the bump is about to be moved up, an inclined surface of a fixing portion of the movable piece and an inclined surface of a fixing portion of the movable piece fix the spherical surface of the bump.

7 Claims, 22 Drawing Sheets

(51) Int. Cl.
*G01R 1/04* (2006.01)
*H01L 23/32* (2006.01)
*H01L 23/00* (2006.01)
*H01R 13/24* (2006.01)
*H05K 7/10* (2006.01)

(52) U.S. Cl.
CPC ............... *H01L 2224/13016* (2013.01); *H01L 2224/14131* (2013.01); *H01R 13/193* (2013.01); *H01R 2201/20* (2013.01)

(56) References Cited

U.S. PATENT DOCUMENTS

| | | | | |
|---|---|---|---|---|
| 6,261,114 | B1 * | 7/2001 | Shimada | H05K 7/1084 439/266 |
| 6,371,782 | B1 * | 4/2002 | Ohashi | H05K 7/1007 439/264 |
| 6,500,017 | B2 * | 12/2002 | Hayakawa | H05K 7/1007 439/268 |
| 6,655,974 | B2 * | 12/2003 | Nakano | H05K 7/1007 439/259 |
| 7,121,858 | B2 * | 10/2006 | Chen | G01R 1/0433 439/259 |
| 7,658,620 | B2 * | 2/2010 | Hsiao | H01R 13/193 439/71 |
| 7,883,348 | B2 * | 2/2011 | Chen | G01R 1/0466 439/259 |
| 8,092,231 | B2 * | 1/2012 | Suzuki | G01R 1/0466 439/70 |
| 8,272,882 | B2 * | 9/2012 | Sakai | G01R 1/0466 439/268 |
| 9,653,833 | B2 * | 5/2017 | Suzuki | H01R 13/2485 |

FOREIGN PATENT DOCUMENTS

JP 2003-297514 A 10/2003
JP 2008-077988 A 4/2008

* cited by examiner

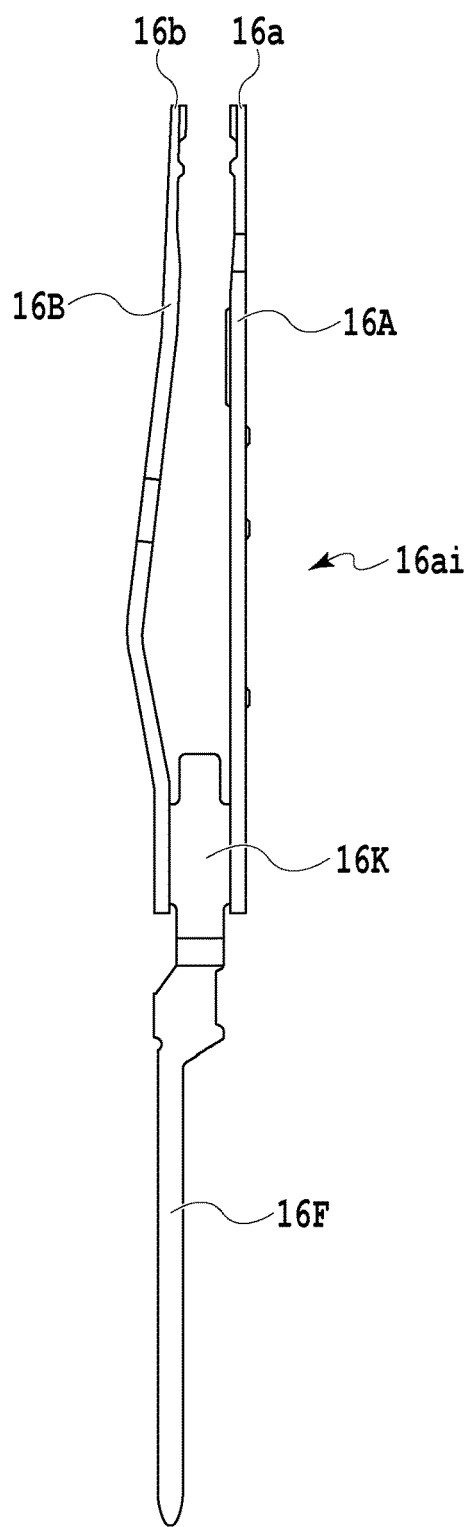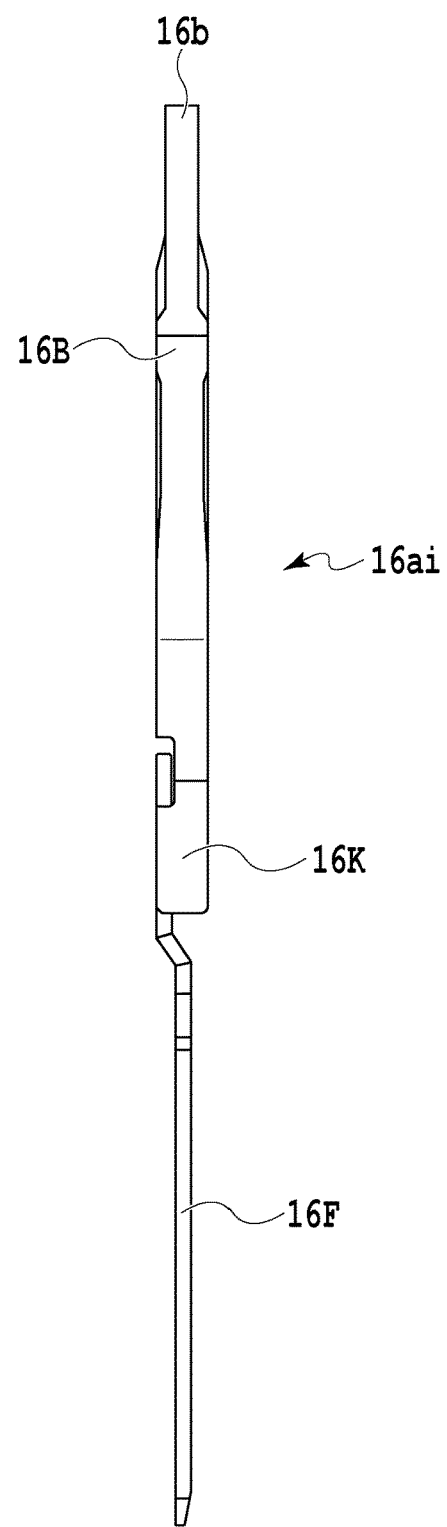
FIG.1A        FIG.1B

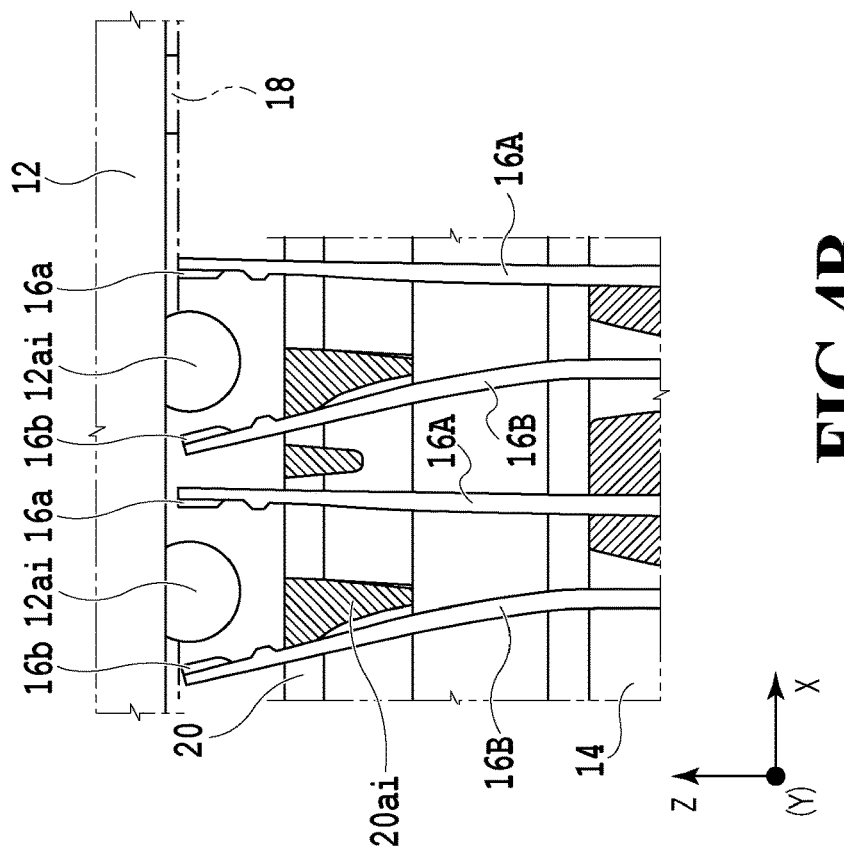
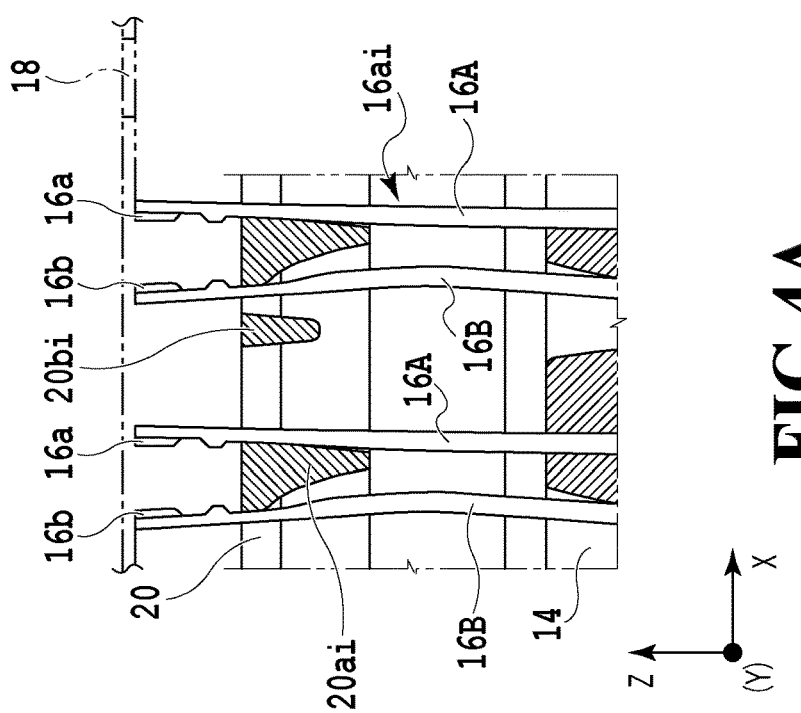
FIG.4A
FIG.4B

CONTACT TERMINAL AND IC SOCKET INCLUDING THE SAME

CROSS REFERENCES TO RELATED APPLICATIONS

This application claims the benefit of Japanese Patent Application No. 2016-034757 filed Feb. 25, 2016, which is hereby incorporated by reference herein in its entirety.

BACKGROUND OF THE INVENTION

Field of the Invention

The present invention relates to a contact terminal and an IC socket including the same.

Description of the Related Art

A variety of semiconductor devices to be mounted on electronic devices and the like are subjected to various tests e.g. a burn-in test at a stage before being mounted, so as to eliminate potential defects therein. A semiconductor device socket made available for such a test is generally referred to as an IC socket, which is located either on a test board or a burn-in board serving as a printed wiring board.

As disclosed in Japanese Patent Application Laid-Open No. 2000-9752, No. 2003-297514, and No. 2008-77988, such an IC socket is provided with a plurality of contact terminals which electrically connect terminals of a semiconductor device to electrode portions of the aforementioned printed wiring board. As shown in Japanese Patent Application Laid-Open No. 2000-9752, for example, there is proposed a contact terminal used for a semiconductor device of a type to be embedded in a BGA (ball grid array)-type package as an object to be inspected, for instance, which comprises: a first contact piece provided with a first protrusion extending in a vertical direction; a second contact piece provided with a second protrusion and a third protrusion extending parallel to each other in the vertical direction with a predetermined interval; a coupling portion which couples a lower end of the first contact piece to a lower end of the second contact piece while bringing the first contact piece and the second contact piece face to face; and a fixation terminal portion connected to the coupling portion, which are configured to pinch each electrode portion in the semiconductor device at an appropriate position depending on the size of the diameter of the spherical electrode portion. Hereby, during a burn-in test, the first protrusion, the second protrusion, and the third protrusion bite into the spherical electrode portion in the semiconductor device by use of elastic forces of the first contact piece and the second contact piece, so that reliable electrical connection can be achieved between the contact terminal and the spherical electrode portion in the semiconductor device.

Moreover, as shown in Japanese Patent Application Laid-Open No. 2003-297514, for example, there is proposed a contact terminal used for a semiconductor device adopting a BGA-type package, in which protrusions of touch portions at tip ends of a pair of elastic contact pieces opposed to each other are formed in alignment with oblique straight lines tangential to a circle of a common circular cross section of a spherical electrode portion with which the protrusions come into contact, so as to avoid a situation that the pair of contact portions of the contact terminal can hardly be come off the spherical electrode portion in the semiconductor device after a test due to sticking of the contact portions to the spherical electrode portion. Herewith, the protrusions of the contact portions are reliably come off the spherical electrode portion, whereby a self-cleaning effect is achieved.

Furthermore, as shown in Japanese Patent Application Laid-Open No. 2008-77988, for example, there is proposed a contact terminal used for a semiconductor device adopting a BGA-type package, in which contact ends at contact point portions of a pair of movable pieces have slanted contact ends so as to pinch a maximum diameter portion of a spherical electrode portion.

SUMMARY OF THE INVENTION

When a burn-in test takes place, there may be a case in which an electrode surface of a semiconductor device adopting a BGA-type package and placed on a socket body of an IC socket is warped upward or downward during the test due to a situation that the electrode surface moves up and down, for example, because of vibration resulting from an impact acting on the IC socket caused by heat generation of a semiconductor element or by an external factor. In this case, if the contact terminal shown in Japanese Patent Application Laid-Open No. 2000-9752 is provided to the IC socket, then there may be a situation that the spherical electrode portion comes out upward from a space between the first contact piece and the second contact piece since all of the first protrusion, the second protrusion, and the third protrusion of the first contact piece and the second contact piece of the contact terminal extend parallel to one another in the vertical direction. Moreover, in the case where the electrode surface of the semiconductor device adopting the BGA-type package is warped downward when the contact terminal shown in Japanese Patent Application Laid-Open No. 2003-297514 is provided to the IC socket, there is a risk of causing scratches on the electrode surface of the semiconductor device attributable to interference of the tip ends of the elastic contact pieces with the electrode surface of the semiconductor device, because the protrusions of the contact portions at the tip ends of the pair of elastic contact pieces have large pinching forces.

In view of the above-described problem, the present invention aims to provide a contact terminal and an IC socket including the same. The contact terminal and the IC socket including the same can avoid detachment of an electrode portion of a semiconductor device from a space between movable contact point portions of a contact terminal, and can avoid damage on the electrode portion of the semiconductor device when the electrode surface of the semiconductor device, which adopts a BGA-type package and is placed on a socket body of the IC socket, is warped in one direction during a test or when the electrode surface moves up and down during the test.

To achieve the above-described, a contact terminal according to the present invention comprises: at least one movable piece selectively coming into contact with a spherical electrode portion in a semiconductor device; and a terminal portion coupled to a proximal end portion of the movable piece. A contact point portion of the movable piece includes at least one touch portion extending along a longitudinal direction of the movable piece, and coming into contact with the spherical electrode portion, and a fixing portion intersecting with a tip end of the touch portion, and having an inclined surface part to fix the spherical electrode portion.

In addition, in the contact terminal according to the present invention including a pair of the movable pieces, a contact point portion of one of the pair of the movable pieces may include at least one touch portion extending along a longitudinal direction of the one movable piece, and coming into contact with the spherical electrode portion, and a fixing portion intersecting with a tip end of the touch portion, and having an inclined surface portion to fix the spherical electrode portion, and a contact point portion of the other one of the pair of the movable pieces may include at least one touch portion extending along a longitudinal direction of the other movable piece, and coming into contact with the spherical electrode portion, and a fixing portion intersecting with a tip end of the touch portion, and having an inclined surface portion to fix the spherical electrode portion. Moreover, a contact point portion of one of the pair of the movable pieces may include a pair of touch portions extending in such a way as to be opposed to each other at a predetermined interval and along a longitudinal direction of the one movable piece, and coming into contact with the spherical electrode portion, and a fixing portion intersecting with tip end of each touch portions, and having an inclined surface portion to fix the spherical electrode portion, and a contact point portion of the other one of the pair of the movable pieces may include a pair of touch portions extending in such a way as to be opposed to each other at a predetermined interval and along a longitudinal direction of the other movable piece, and coming into contact with the spherical electrode portion, and a fixing portion intersecting with tip end of the each touch portions, and having an inclined surface portion to fix the spherical electrode portion.

And then, a contact point portion of one of the pair of the movable pieces may include a pair of touch portions extending in such a way as to be opposed to each other at a predetermined interval and along a longitudinal direction of the one movable piece, and coming into contact with the spherical electrode portion, and a contact point portion of the other one of the pair of the movable pieces may include a pair of touch portions extending in such a way as to be opposed to each other at a predetermined interval and along a longitudinal direction of the other movable piece, and coming into contact with the spherical electrode portion, and a fixing portion intersecting with tip end of each touch portion, and having an inclined surface portion to fix the spherical electrode portion.

A contact point portion of one of the pair of the movable pieces may include at least one touch portion extending along a longitudinal direction of the one movable piece, and coming into contact with the spherical electrode portion, and a contact point portion of the other one of the pair of the movable pieces may include a pair of touch portions extending in such a way as to be opposed to each other at a predetermined interval and along a longitudinal direction of the other movable piece, and coming into contact with the spherical electrode portion, and a fixing portion intersecting with tip end of each touch portion, and having an inclined surface portion to fix the spherical electrode portion.

A contact point portion of one of the pair of the movable pieces may include at least one touch portion extending along a longitudinal direction of the one movable piece, and coming into contact with the spherical electrode portion, and two fixing portions intersecting with a tip end of each touch portion, each fixing portion having an inclined surface portion to fix the spherical electrode portion, and a contact point portion of the other one of the pair of the movable pieces may include at least one touch portion extending along a longitudinal direction of the other movable piece, and coming into contact with the spherical electrode portion, and two fixing portions intersecting with a tip end of each touch portion, each fixing portion having an inclined surface portion to fix the spherical electrode portion.

An IC socket according to the present invention includes: a socket body including the contact terminal described above; a semiconductor device placement portion on which a semiconductor device having a spherical electrode portion is detachably placed, the semiconductor device placement portion being provided in the socket body; and a movable piece drive mechanism portion movably provided in the socket body, and configured to actuate at least one of a pair of movable pieces of the contact terminal in such a way as to come close to or move away from the spherical electrode portion.

According to the contact terminal of the present invention and the IC socket including the same, the contact point portion of at least one of the pair of movable pieces includes: at least one touch portion which extends along the longitudinal direction of the movable piece and comes into contact with the spherical electrode portion; and the fixing portion intersecting with the tip end of the touch portion and having the inclined surface portion to fix the spherical electrode portion. Thus, it is possible to avoid detachment of the electrode portion of the semiconductor device from a space between the movable contact point portions of the contact terminal, and avoiding damage on the electrode portion of the semiconductor device when the electrode surface of the semiconductor device adopting the BGA-type package and being placed on the socket body of the IC socket is warped in one direction during a test or when the electrode surface moves up and down during the test.

Further features of the present invention will become apparent from the following description of exemplary embodiments with reference to the attached drawings.

BRIEF DESCRIPTION OF THE DRAWINGS

FIG. 1A is a front view showing an overall configuration of a contact terminal of a first embodiment according to the present invention, and FIG. 1B is a side view of the contact terminal of FIG. 1A;

FIGS. 4A and 4B are views made available for explaining operations of the example illustrated in FIG. 2, respectively;

DESCRIPTION OF THE EMBODIMENTS

Figure 3:
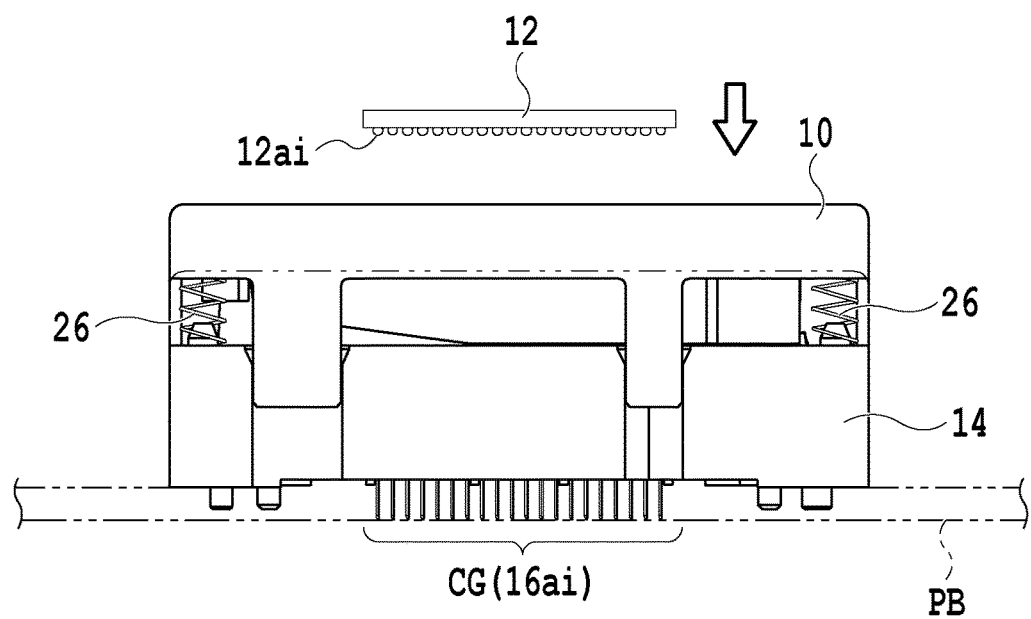
FIG. 3 is a front view of the example illustrated in FIG. 2.

FIG. 3 schematically shows external appearance of an IC socket (a semiconductor device socket) applying embodiments of a contact terminal according to the present invention.

In FIG. 3, the semiconductor device socket comprises a socket body 14, a contact terminal group CG, and a cover member 10. The socket body 14 is fixed onto a printed wiring board PB, and is provided with a housing which detachably accommodates a semiconductor device 12 to be described later. The contact terminal group CG is configured to electrically connect respective bumps (electrode portions) of the attached semiconductor device 12 to corresponding electrode portions of the printed wiring board PB. The cover member 10 is provided above the socket body 14 in a vertically movable manner, and is configured to cause contact point portions of pairs of movable pieces of contact terminals 16$ai$ to be described later, which constitute the contact terminal group CG, selectively to come into contact with or move away from the respective bumps (the electrode portions) of the semiconductor device 12.

On each side of an outer peripheral surface of the socket body 14, two elongated grooves are formed parallel to each other and substantially orthogonal to a surface of the printed wiring board PB. A nib of the cover member 10 to be described later is slidably engaged with each of the grooves. A step is formed at an end of each groove such that a tip end of each nib is fixed with the step when the cover member 10 is located at the uppermost end position.

Figure 2:
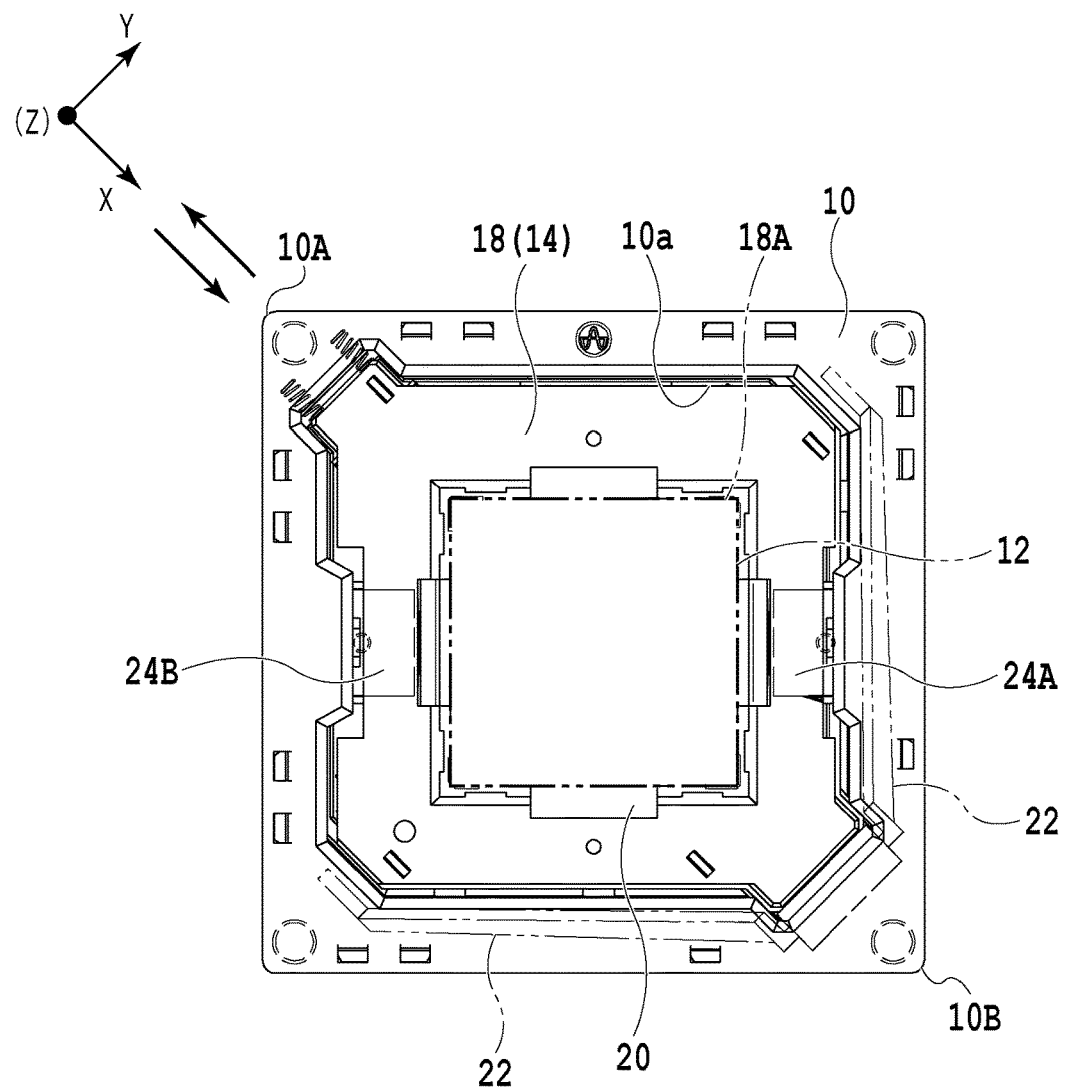
FIG. 2 is a plan view showing external appearance of an example of an IC socket according to the present invention.

As shown in FIG. 2, the socket body 14 is provided with a positioning member 18 having a substantially square shape. A housing 18A to accommodate the semiconductor device 12 subjected to a test is provided at the center of the positioning member 18. The semiconductor device 12 to be mounted on an example of the IC socket according to the present invention is assumed to be a semiconductor device of a square shape adopting a package of either a BGA type or a FBGA type, for example. It will be noted that the shape of the package is not limited to the aforementioned example, and may be a rectangle. As shown in FIG. 4B, the semiconductor device 12 includes a plurality of bumps 12$ai$ (i=1 to n, n is a positive integer) serving as electrode portions having a substantially semispherical shape, which are arranged in a matrix at predetermined intervals on a lower surface of the semiconductor device 12. A stand-off height of each bump 12$ai$ of the semiconductor device 12 is standardized in accordance with a distance between two adjacent bumps 12$ai$ and with a maximum diameter of each bump 12$ai$, for example.

The positioning member 18 is supported by a base portion (not shown) on the inside of socket body 14. The housing 18A thereof is formed from a flat surface portion (an embedding surface portion) on which the package of the semiconductor device 12 is placed, and side wall portions to be formed around the flat surface portion, respectively. The flat surface portion is formed substantially parallel to the surface of the printed wiring board PB located therebelow. Positioning portions that come into engagement with four corners of the package of the attached semiconductor device 12, respectively, are formed at four corners on the inside of the respective side wall portions. Accordingly, the corners of the package of the attached semiconductor device 12 are engaged with the positioning portions, respectively, and the positioning of the bumps 12$ai$ therein relative to the pair of movable pieces of the contact terminal to be described later is thus established.

In addition, fine holes into which the contact point portions of the pairs of movable pieces of the contact terminal and the above-described bumps are inserted, respectively, are formed in a matrix in the flat surface portion.

At a position of the socket body 14 immediately below the positioning member 18, a slider 20 (see FIG. 4A) serving as a movable piece actuation member is provided in such a way as to be reciprocable along the X-coordinate axis of the orthogonal coordinate system in FIG. 2. Note that in FIG. 2, the X-coordinate axis is defined along a diagonal line connecting a vertex 10A and a vertex 10B of corners of the cover member 10 and of the socket body 14 to each other.

The slider 20 is made movable through lever members 22 and in conjunction with the vertical movement of the cover member 10. The slider 20 is moved through either a link mechanism including the lever members 22 and being provided to the socket body 14 or a cam mechanism formed on the cover member 10. Hereby, one of the contact point parts of the pair of movable pieces of each contact terminal 16ai (i=1 to n, n is a positive integer) (see FIG. 4A) is selectively caused to come close to or move away from the other contact point portion.

The slider 20 has a plurality of arrays of elongated openings corresponding to the plurality of holes in the positioning member 18 mentioned above. The adjacent arrays of openings are partitioned by a partition wall provided along the array direction. Moreover, as shown in FIGS. 4A and 4B, the inside of each array of openings is partitioned by pressing portions 20ai (i=1 to n, n is a positive integer), each of which is configured to press and move one of the pair of movable pieces of the contact terminal along with the movement of the slider 20. A movable piece 16A and a movable piece 16B (hereinafter also referred to as a first movable piece 16A and a second movable piece 16B) constituting the pair in each contact terminal 16ai are provided to face each other while interposing the pressing portion 20ai therebetween. Thus, respective contact point parts 16a and 16b of the pair of movable pieces 16A and 16B project from the inside of the array of openings toward the corresponding holes in the positioning member 18 located above, respectively.

At a portion of the socket body 14 slidably supporting a lower end of the slider 20, openings into which fixation parts of the contact terminals 16ai are press-fitted are formed in such a way as to be substantially perpendicular to the surface of the printed wiring board PB. The openings are partitioned by partition walls.

As shown in FIG. 2, the cover member 10 has a substantially square opening 10a located at a central part of the cover member 10 and designed to allow passage of the semiconductor device 12 to be attached and detached. Moreover, as shown in FIG. 3, coil springs 26 serving as biasing members to bias the cover member 10 in a direction to move away from the socket body 14 are provided between the cover member 10 and the socket body 14.

As shown in the enlarged view of FIGS. 1A and 1B, each contact terminal 16ai (i=1 to n, n is a positive integer) as the first embodiment of the contact terminal according to the present invention is made of a thin metal plate material, and comprises: a fixation part 16K provided with a nib portion to be press-fitted into the corresponding opening in the socket body 14 mentioned above; a soldering terminal part 16F extending to one end side of the fixation part 16K; and the movable pieces 16A and 16B extending to the other end side of the fixation part 16K.

The movable piece 16A and the movable piece 16B, which are opposed to each other and made elastically displaceable, have a contact point portion 16a and a contact point portion 16b (hereinafter also referred to as a first contact point portion 16a and a second contact point portion 16b) located at tip ends of the movable pieces, respectively, in such a way as to be opposed to each other.

Figure 5A:
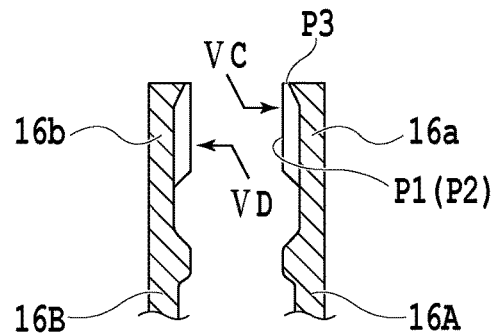
FIG. 5A is a partial enlarged view of contact point portions in the example illustrated in FIG. 1A.
Figure 5B:
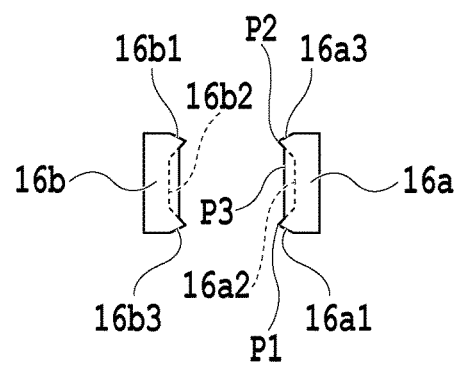
FIG. 5B is a top view of the contact point portions of FIG. 5A.
Figure 5C:
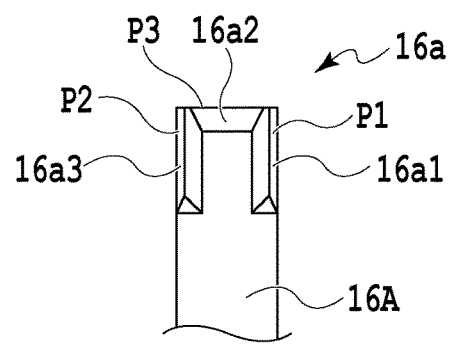
FIG. 5C is a view in a direction of an arrow VC in FIG. 5A.

As shown in the enlarged view of FIGS. 5A to 5C, the contact point part 16a has: a first touch portion 16a1 and a second touch portion 16a3 being located on one surface and extending parallel to each other by a predetermined length along the corresponding long sides; and a fixing portion 16a2 connecting one end of the first touch portion 16a1 to one end of the second touch portion 16a3. Here, the touch portions 16a1 and 16a3, and the fixing portion 16a2 are arranged in an inverted U-shape. Each of the first touch portion 16a1, the fixing portion 16a2, and the second touch portion 16a3 has a substantially triangular cross section that is uniformly provided on a surface of the movable piece 16A opposed to the movable piece 16B. A ridge line P1 corresponding to continuous peaks of the first touch portion 16a1, a ridge line P2 corresponding to continuous peaks of the second touch portion 16a3, and a ridge line P3 corresponding to continuous peaks of the fixing portion 16a2 project toward the movable piece 16B.

Figure 6A:
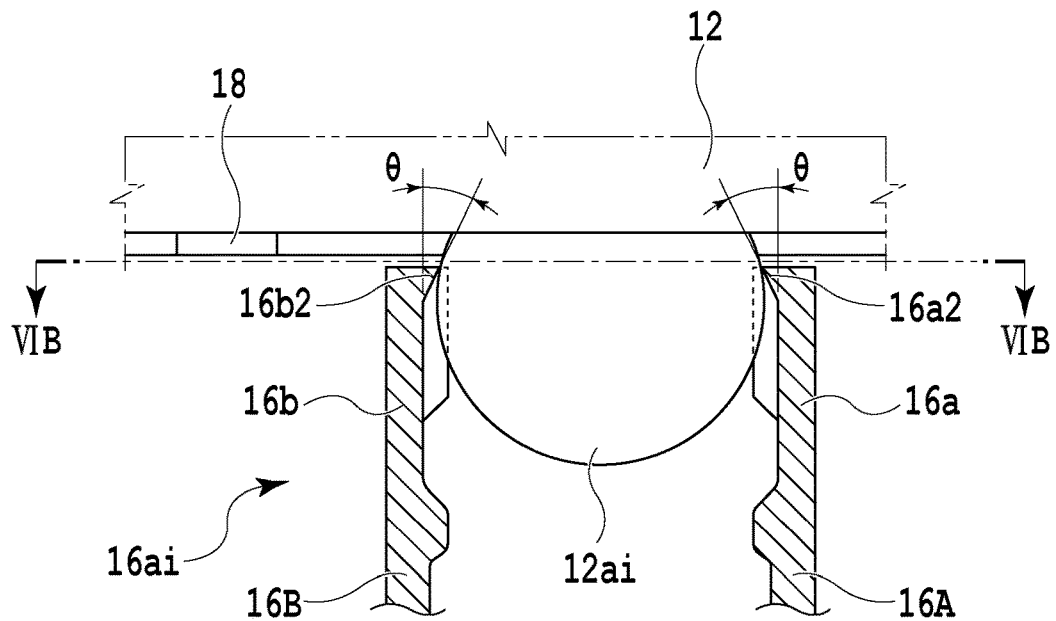
FIG. 6A is an enlarged view of contact point portions in a state of pinching a bump in the example illustrated in FIG. 1A.
Figure 6B:
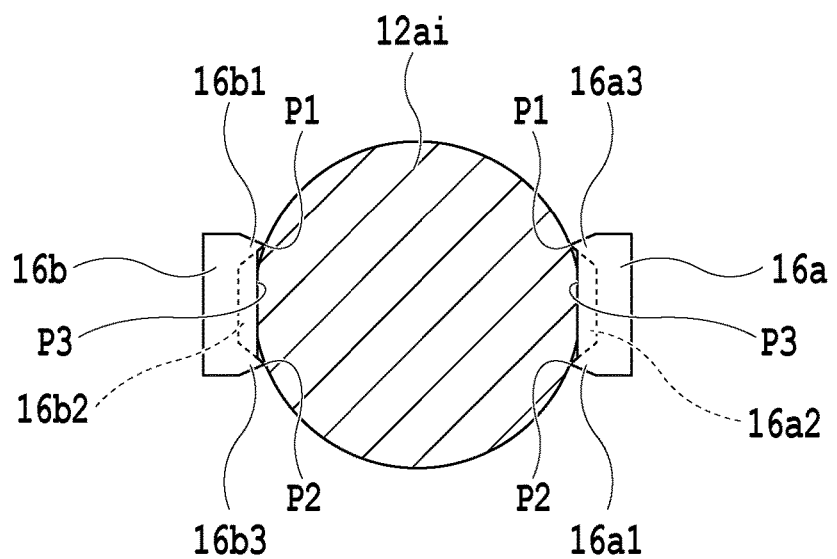
FIG. 6B is a cross-sectional view taken along VIB-VIB line in FIG. 6A.

As shown in FIG. 5B, the respective ridge lines P1 and P2 of the first touch portion 16a1 and the second touch portion 16a3 project slightly more outward than the ridge line P3 of the fixing portion 16a2 does. Moreover, as shown in FIG. 6A, the fixing portion 16a2 has a surface inclined from top left to bottom right at a given angle $\theta$ with respect to the surface of the movable piece 16A so as to fix a spherical surface of the bump 12ai.

The contact point portion 16b has a first touch portion 16b1, a second touch portion 16b3, and a fixing portion 16b2, which are similar to the first touch portion 16a1, the second touch portion 16a3, and the fixing portion 16a2 of the contact point part 16a respectively corresponding thereto, and description thereof will therefore be omitted.

In the above-described configuration, when the cover member 10 is moved down to the predetermined lowermost end position against the biasing force of the coil springs 26 therein, the slider 20 and the pressing portions 20ai are moved leftward as shown in FIG. 4B through either the link mechanism or the cam mechanism mentioned above. Thus, the movable piece 16B out of the pair of movable pieces 16A and 16B of each contact terminal is caused to move away from the other movable piece 16A.

Next, after the semiconductor device 12 is placed in the housing 18A of the positioning member 18, as the cover member 10 is released from the pressure applied thereto, the cover member 10 is moved up from the lowermost end position to the uppermost end position by the biasing force of the coil springs 26 mentioned above. Accordingly, as shown in FIG. 4A, the slider 20 and the pressing portions 20ai are moved rightward in FIG. 4B by resilience of the contact terminals and a biasing force of a not-illustrated biasing member. Thus, the movable piece 16B out of the pair of movable pieces 16A and 16B of each contact terminal 16ai is caused to come close to the other movable piece 16A again. As a consequence, each bump 12ai of the semiconductor device 12 attached to the housing 18A is pinched by the first contact point part 16a and the second contact point part 16b of the corresponding contact terminal 16ai, and is electrically connected thereto as shown in FIG. 6A.

On the other hand, when the semiconductor device 12 is detached from the housing 18A of the positioning member 18, the above-mentioned pressing operation on the cover member 10 is performed against the biasing force of the coil springs 26 therein. Thus, the slider 20 and the pressing portions 20ai are moved as in the above-described case.

Figure 7A:
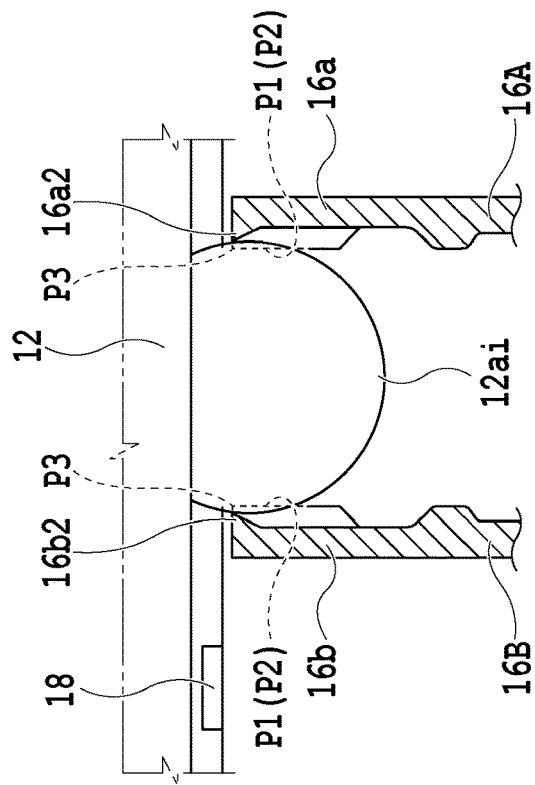
FIGS. 7A and 7B are views made available for explaining operations of the contact point portions in the example illustrated in FIG. 1A, respectively.
Figure 7B:
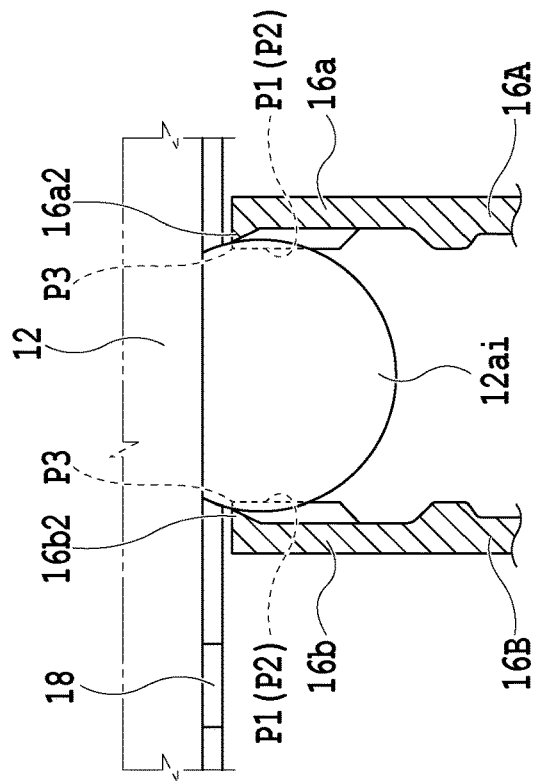
Figure 8:
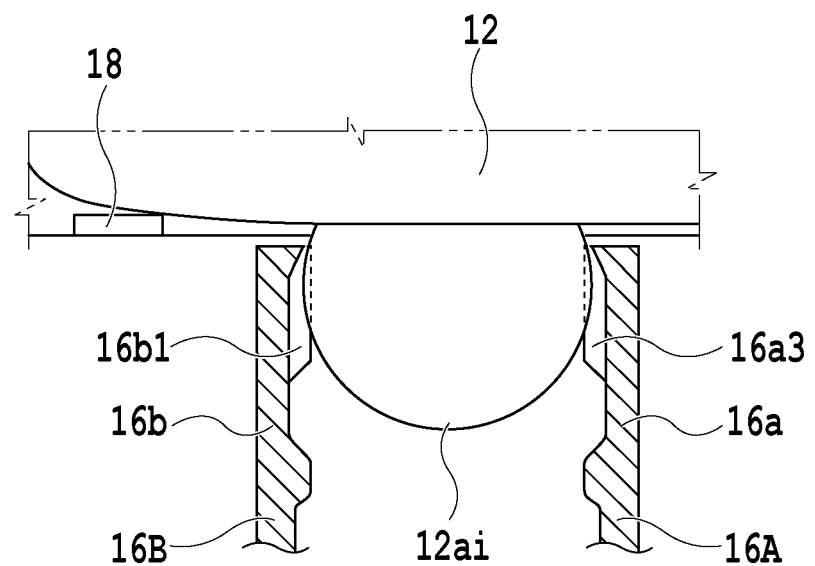
FIG. 8 is a view made available for explaining operations of the contact point portions in the example illustrated in FIG. 1A in the case where an electrode surface of a semiconductor device is warped downward.

Moreover, as shown in FIG. 7A, when the first touch portion 16a1 and the second touch portion 16a3 of the movable piece 16A and the first touch portion 16b1 and the second touch portion 16b3 of the movable piece 16B pinch the spherical surface of the corresponding bump 12ai of the semiconductor device 12, the ridge line P3 of the fixing portion 16b2 bites into the surface of the bump 12ai. In this case, as shown in FIG. 7B, the bump 12ai may be moved up if an electrode surface of the semiconductor device 12 is warped upward or if the electrode surface is moved up and down due to vibration attributed to an impact on the IC socket during a burn-in test. In such cases, the inclined surface of the fixing portion 16a2 of the movable piece 16A and the inclined surface of the fixing portion 16b2 of the movable piece 16B fix the spherical surface of the bump 12ai. Therefore, the bump 12ai of the semiconductor device 12 is prevented from coming off the space between the pair of movable pieces 16A and 16B. Moreover, as shown in FIG. 8, when the first touch portion 16a1 and the second touch portion 16a3 of the movable piece 16A and the first touch portion 16b1 and the second touch portion 16b3 of the movable piece 16B bite into and pinch the spherical surface of the corresponding bump 12ai of the semiconductor device 12, if the electrode surface of the semiconductor device 12 is warped downward during the burn-in test, the electrode surface of the semiconductor device 12 comes into contact with the embedding surface of the housing 18A of the positioning member 18. Thus, a given clearance is defined between an upper end surface of each of the movable pieces 16A and 16B and the electrode surface of the semiconductor device 12. Accordingly, the electrode surface of the semiconductor device 12 is free from risk of damage by the upper end surfaces of the movable pieces 16A and 16B.

Figure 5D:
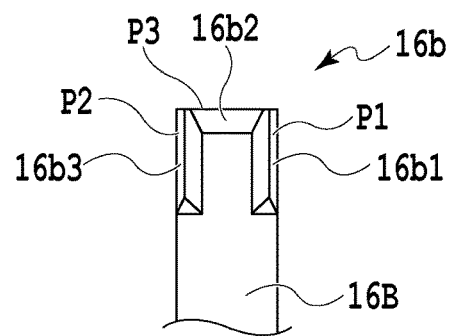
FIG. 5D is a view in a direction of an arrow VD in FIG. 5A.
Figure 9A:
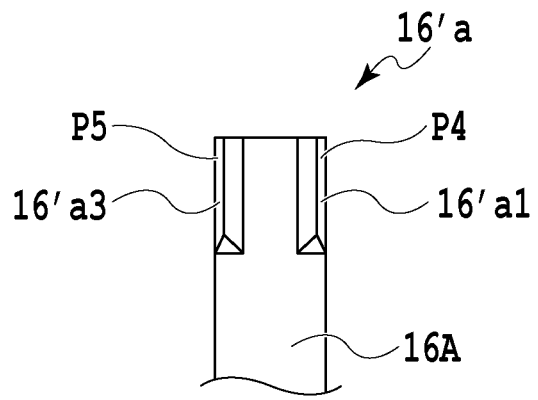
FIG. 9A is a partial enlarged view of a contact point portion of one of movable pieces of a second embodiment of a contact terminal according to the present invention.
Figure 9B:
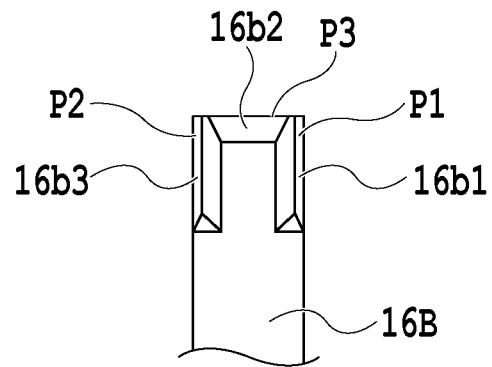
FIG. 9B is a partial enlarged view of a contact point portion of the other movable piece opposed to the one movable piece.

FIGS. 9A and 9B enlargedly show contact point portions of a second embodiment of a contact terminal according to the present invention. Constituents in FIG. 9B which are the same as the constituents in FIG. 5D are denoted by the same reference numerals and overlapping explanations thereof will be omitted.

The first movable piece 16A and the second movable piece 16B have, respectively, a contact point portion 16'a and the contact point portion 16b located at tip ends thereof in such a way as to be opposed to each other.

As shown in the enlarged view of FIG. 9A, the contact point part 16'a has a first touch portion 16'a1 and a second touch portion 16'a3 being located on one surface and extending parallel to each other by a predetermined length along the corresponding long sides. A ridge line P4 and a ridge line P5 of triangular cross sections of the first touch portion 16'a1 and the second touch portion 16'a3 project toward the movable piece 16B, respectively. When the contact point part 16'a and the contact point part 16b pinch the bump 12ai of the semiconductor device 12, the ridge line P4 and the ridge line P5 bite into the spherical surface of the bump 12ai of the semiconductor device 12.

Figure 10A:
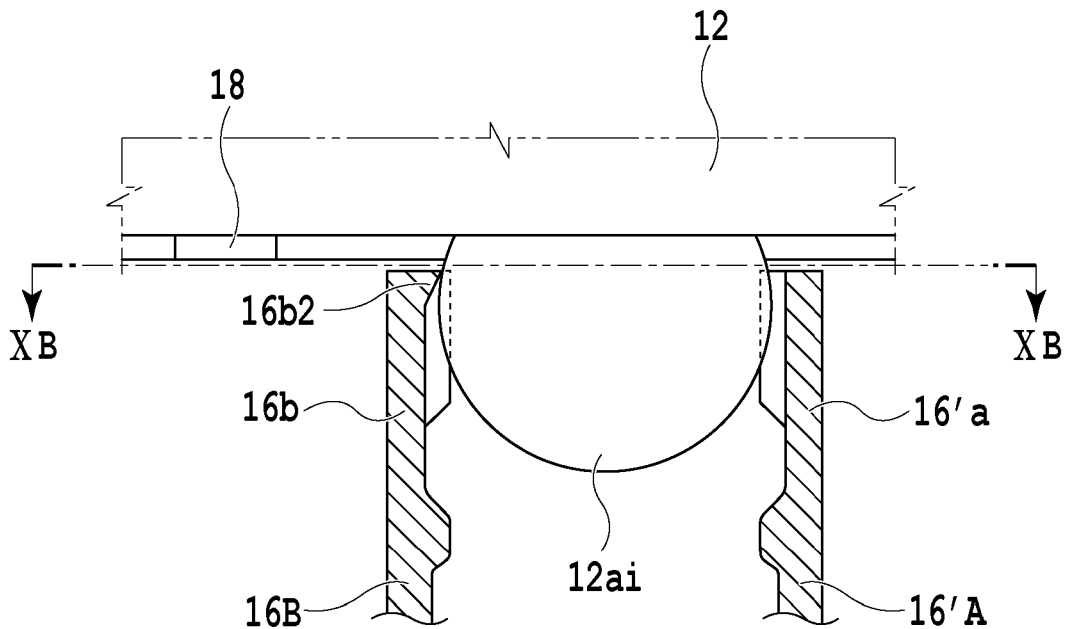
FIG. 10A is a partial enlarged view of the contact point portions in a state of pinching a bump in the example illustrated in FIG. 9A.
Figure 10B:
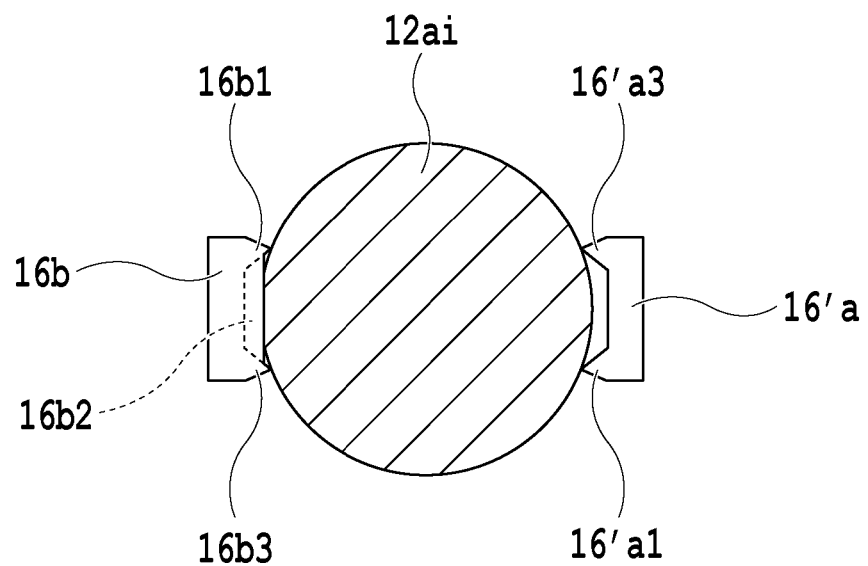
FIG. 10B is a cross-sectional view taken along XB-XB line in FIG. 10A.

In the above-described configuration, as shown in FIGS. 10A and 10B, when the ridge line P4 of the first touch portion 16'a1 and the ridge line P5 of the second touch portion 16' a3 of the movable piece 16A and the ridge line P1 of the first touch portion 16b1 and the ridge line P2 of the second touch portion 16b3 of the movable piece 16B bite into and pinch the spherical surface of the corresponding bump 12ai of the semiconductor device 12, the bump 12ai may be moved up if the electrode surface of the semiconductor device 12 is warped upward or if the electrode surface is moved up and down due to vibration attributed to an impact on the IC socket during the burn-in test. In such cases, the inclined surface of the fixing portion 16b2 of the movable piece 16B fixes the spherical surface of the bump 12ai. Herewith, the bump 12ai of the semiconductor device 12 is prevented from coming off the space between the pair of movable pieces 16A and 16B.

Figure 11A:
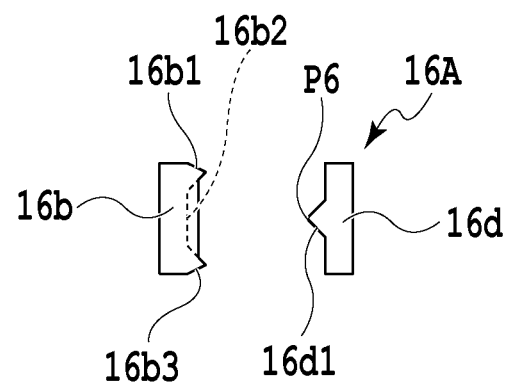
FIG. 11A is a partial enlarged view of contact point portions of a pair of movable pieces of a third embodiment of a contact terminal according to the present invention.
Figure 11B:
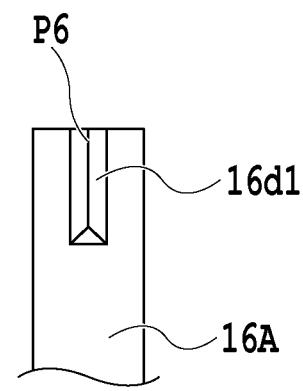
FIG. 11B is a partial enlarged view of the contact point portion of one of the pair of movable pieces illustrated in FIG. 11A.

FIGS. 11A and 11B enlargedly show contact point parts of a third embodiment of a contact terminal according to the present invention. Constituents in FIG. 11A which are the same as the constituents in FIG. 5D are denoted by the same reference numerals and overlapping explanations thereof will be omitted.

The elastically displaceable movable pieces 16A and 16B have, respectively, a contact point part 16d and the contact point part 16b located at tip ends thereof in such a way as to be opposed to each other.

As shown in the enlarged view of FIGS. 11A and 11B, the contact point portion 16d has a first touch portion 16d1 being located at a central part on one surface and extending by a predetermined length along the long side. The first touch portion 16d1 has a substantially triangular cross section, and has a ridge line P6 corresponding to continuous peaks projecting toward the movable piece 16B.

Figure 12:
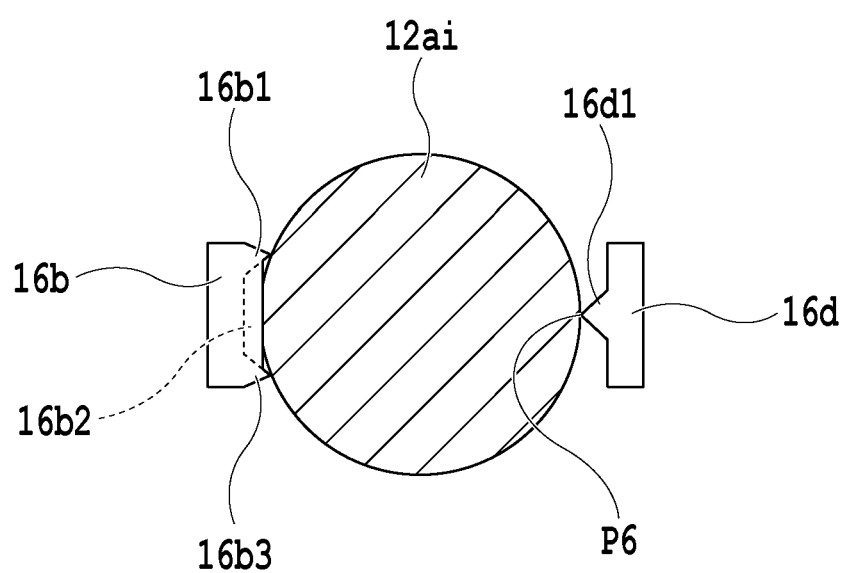
FIG. 12 is an enlarged view of the contact point portions in a state of pinching a bump in the example illustrated in FIG. 11A.

In the above-described configuration, as shown in FIG. 12, when the first touch portion 16d1 of the movable piece 16A and the first touch portion 16b1 and the second touch portion 16b3 of the movable piece 16B bite into the spherical surface of the corresponding bump 12ai of the semiconductor device 12 and pinch the bump 12ai, the bump 12ai may be moved up if the electrode surface of the semiconductor device 12 is warped upward or if the electrode surface is moved up and down due to vibration attributed to an impact on the IC socket during the burn-in test. In such cases, the inclined surface of the fixing portion 16b2 of the movable piece 16B fixes the spherical surface of the bump 12ai. Hereby, the bump 12ai of the semiconductor device 12 is prevented from coming off the space between the pair of movable pieces 16A and 16B.

Figure 16:
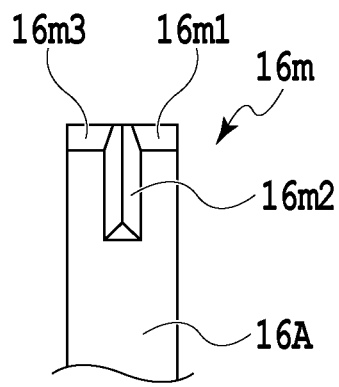
FIG. 16 is a view showing a variation of the contact point portion of the movable piece in the example illustrated in FIG. 11B.

Although the above-described contact point portion 16d of the movable piece 16A has the single first touch portion 16d1 formed at the central part on the one surface, the present invention is not limited only to this example. For instance, as shown in FIG. 16, there may be provided a contact point part 16m having a first fixing portion 16m1 and a second fixing portion 16m3, which intersect with one end of a first touch portion 16m2. Each of the first touch portion 16m2, the first fixing portion 16m1, and the second fixing portion 16m3 has a substantially triangular cross section. A ridge line corresponding to continuous peaks at one corner of each triangular cross section projects toward the movable piece 16B. Furthermore, the movable piece 16B opposed to the movable piece 16A may have the first touch portion 16m2, the first fixing portion 16m1, and the second fixing portion 16m3.

Figure 13A:
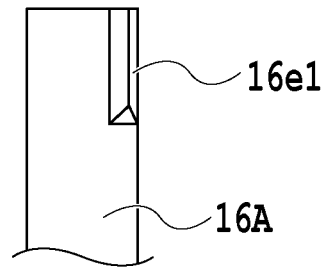
FIG. 13A is a view showing a variation of the contact point portion of one of the pair of movable pieces in the example illustrated in FIG. 11A.
Figure 13B:
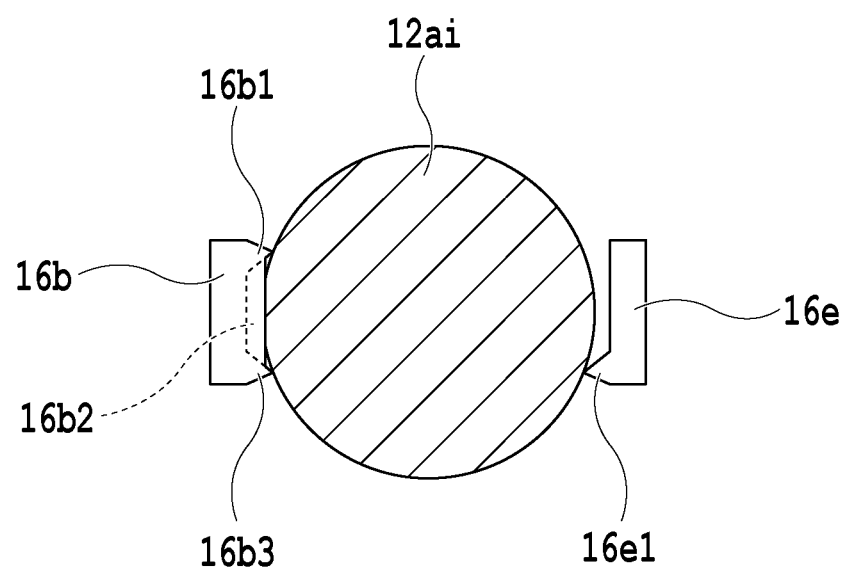
FIG. 13B is an enlarged view of the contact point portion illustrated in FIG. 13A and the contact point portion illustrated in FIG. 11A in a state of pinching a bump.

Moreover, although the first touch portion 16d1 of the contact point part 16d of the movable piece 16A is formed at the central part in a width direction of the first movable piece 16A as shown in FIG. 11B, the present invention is not limited only to this example. For instance, as shown in FIGS. 13A and 13B, there may be provided a contact point part 16e including a first touch portion 16e1 extending by a predetermined length on a right end of one surface and along the long side. The first touch portion 16e1 has a substantially triangular cross section. Moreover, a ridge line corresponding to continuous peaks at one corner of the triangular cross section projects toward the movable piece 16B. Note that constituents in FIG. 13B which are the same as the constituents in FIG. 5B are denoted by the same reference numerals and overlapping explanations thereof will be omitted.

Figure 14A:
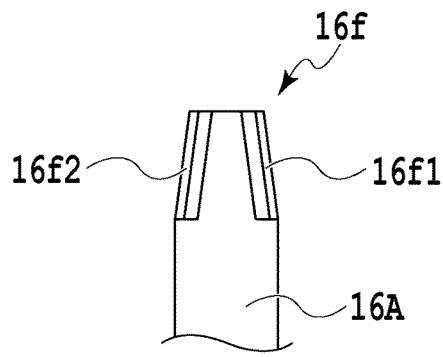
FIG. 14A is a view showing a variation of the contact point portion of the movable piece in the example illustrated in FIG. 9A.
Figure 14B:
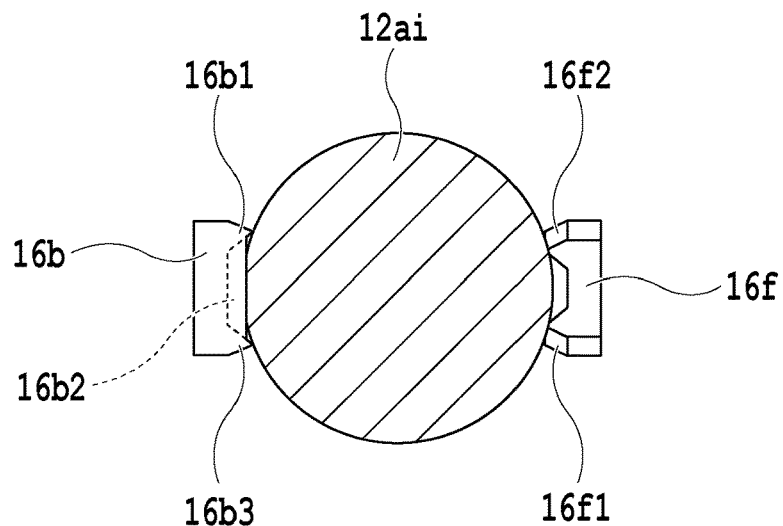
FIG. 14B is an enlarged view of the contact point portion illustrated in FIG. 14A and the contact point portion illustrated in FIG. 5D in a state of pinching a bump.

Furthermore, as shown in FIGS. 14A and 14B, for example, a contact point portion 16f of the movable piece 16A may have a first touch portion 16f1 and a second touch portion 16f2 being located on one surface and extending by a predetermined length along the corresponding long sides and at a certain interval in between. Ends on one side of the first touch portion 16f1 and the second touch portion 16f2 are inclined at given gradients in such a way as to gradually come close to each other toward a tip end of the contact point part 16f. Each of the first touch portion 16f1 and the second touch portion 16f2 has a substantially triangular cross section. Moreover, a ridge line corresponding to continuous peaks at one corner of the triangular cross section projects toward the movable piece 16B. Note that constituents in FIG. 14B which are the same as the constituents in FIG. 5B are denoted by the same reference numerals and overlapping explanations thereof will be omitted. In the meantime, the movable piece 16B may include the first touch portion 16f1 and the second touch portion 16f2.

Figure 14C:
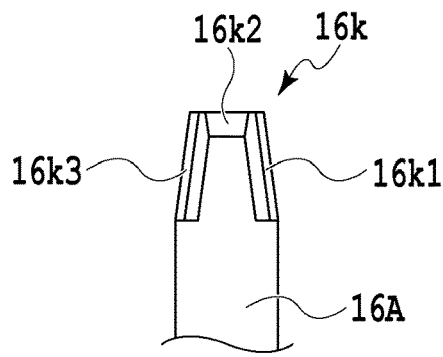
FIG. 14C is a view showing still another variation of the contact point portion of the movable piece in the example illustrated in FIG. 9A.
Figure 15A:
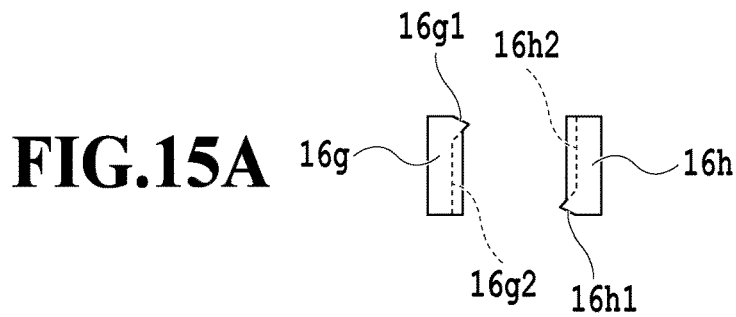
FIG. 15A is a partial enlarged top plan view showing contact point portions of a pair of movable pieces of a fourth embodiment of a contact terminal according to the present invention.
Figure 15B:
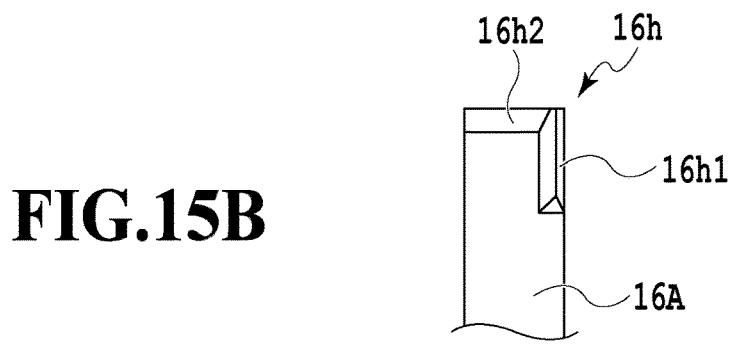
FIG. 15B is a view of the contact point portion of one of the pair of movable pieces illustrated in FIG. 15A.
Figure 15C:
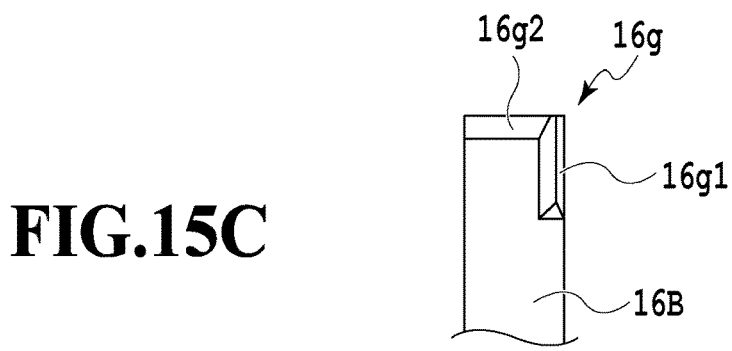
FIG. 15C is a view of the contact point portion of the other one of the pair of movable pieces illustrated in FIG. 15A.
Figure 15D:
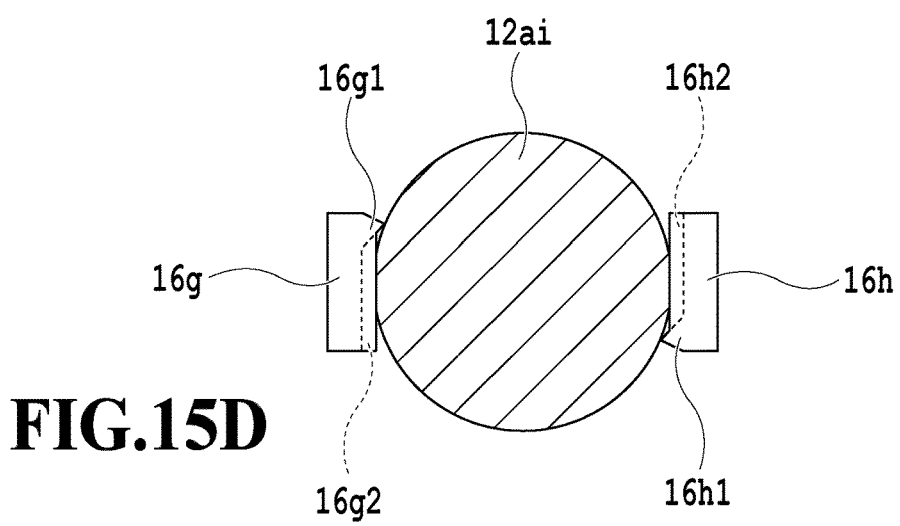
FIG. 15D is an enlarged view showing the respective contact point portions in the example illustrated in FIG. 15A in a state of pinching a bump.

Moreover, as shown in FIG. 14C, for example, instead of the contact point part 16f of the movable piece 16A mentioned above, there may be provided a contact point part 16k of the movable piece 16A which has: a first touch portion 16k1 and a second touch portion 16k3 being located on one surface and extending by a predetermined length along the corresponding long sides; and a fixing portion 16k2 connecting one end of the first touch portion 16k1 to one end of the second touch portion 16k3. The first touch portion 16k1 and the second touch portion 16k3 are formed at a certain interval such that ends on one side thereof gradually come close to each other toward a tip end of the contact point part 16k. Each of the first touch portion 16k1, the second touch portion 16k3, and the fixing portion 16k2 has a substantially triangular cross section. Moreover, a ridge line corresponding to continuous peaks at one corner of the triangular cross section projects toward the movable piece 16B. The ridge lines of the first touch portion 16k1 and the second touch portion 16k3, each of which corresponds to the continuous peaks at the one corner of the triangular cross section, project slightly more outward than does the ridge line of the fixing portion 16k2, which corresponds to the continuous peaks at the one corner of the triangular cross section. Hereby, a grasp performance of the bump 12ai is further enhanced.

FIGS. 15A to 15D enlargedly show contact point portions of a fourth embodiment of a contact terminal according to the present invention. Elastically displaceable movable pieces 16A and 16B have contact point parts 16h and 16g, respectively, which are located at tip ends and opposed to each other. The contact point portion 16h has a first touch portion 16h1 being located on one surface and extending by a predetermined length along the long side, and a fixing portion 16h2 which intersects with one end of the first touch portion 16h1. Each of the first touch portion 16h1 and the fixing portion 16h2 has a substantially triangular cross section. A ridge line corresponding to continuous peaks at one corner of each triangular cross section projects toward the movable piece 16B. The ridge line of the first touch portion 16h1 corresponding to the continuous peaks at the one corner of the triangular cross section thereof projects slightly more outward than one peak of the triangular cross section of the fixing portion 16h2.

The contact point part 16g has a first touch portion 16g1 being located on one surface and extending by a predetermined length along the long side, and a fixing portion 16g2 which intersects with one end of the first touch portion 16g1. Structures of the first touch portion 16g1 and the fixing portion 16g2 are the same as the above-mentioned structures of the first touch portion 16h1 and the fixing portion 16h2, and descriptions of the first touch portion 16g1 and the fixing portion 16g2 will therefore be omitted. According to this configuration as well, the bump 12ai is pinched by the movable piece 16A and the movable piece 16B. In this configuration, the bump 12ai is prevented from coming off the space between the movable pieces due to an impact and the like during a burn-in test.

Figure 17:
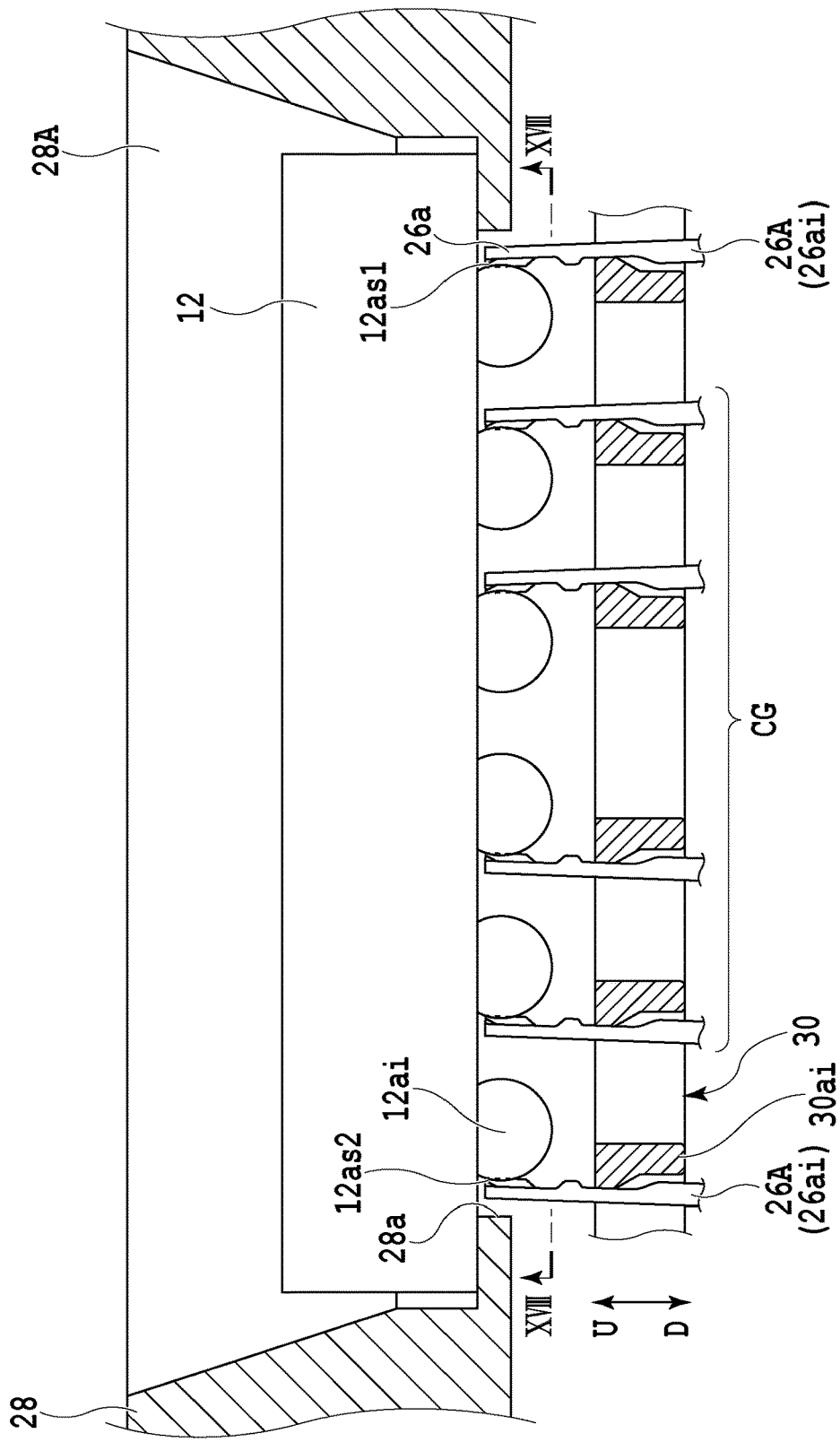
FIG. 17 is a partial enlarged cross-sectional view which shows a main part of another example of a semiconductor device socket applying a fifth embodiment of a contact terminal according to the present invention.

FIG. 17 is a partial enlargedly cross-sectional view which shows a main part of another example of a semiconductor device socket applying a fifth embodiment of a contact terminal according to the present invention.

Figure 18:
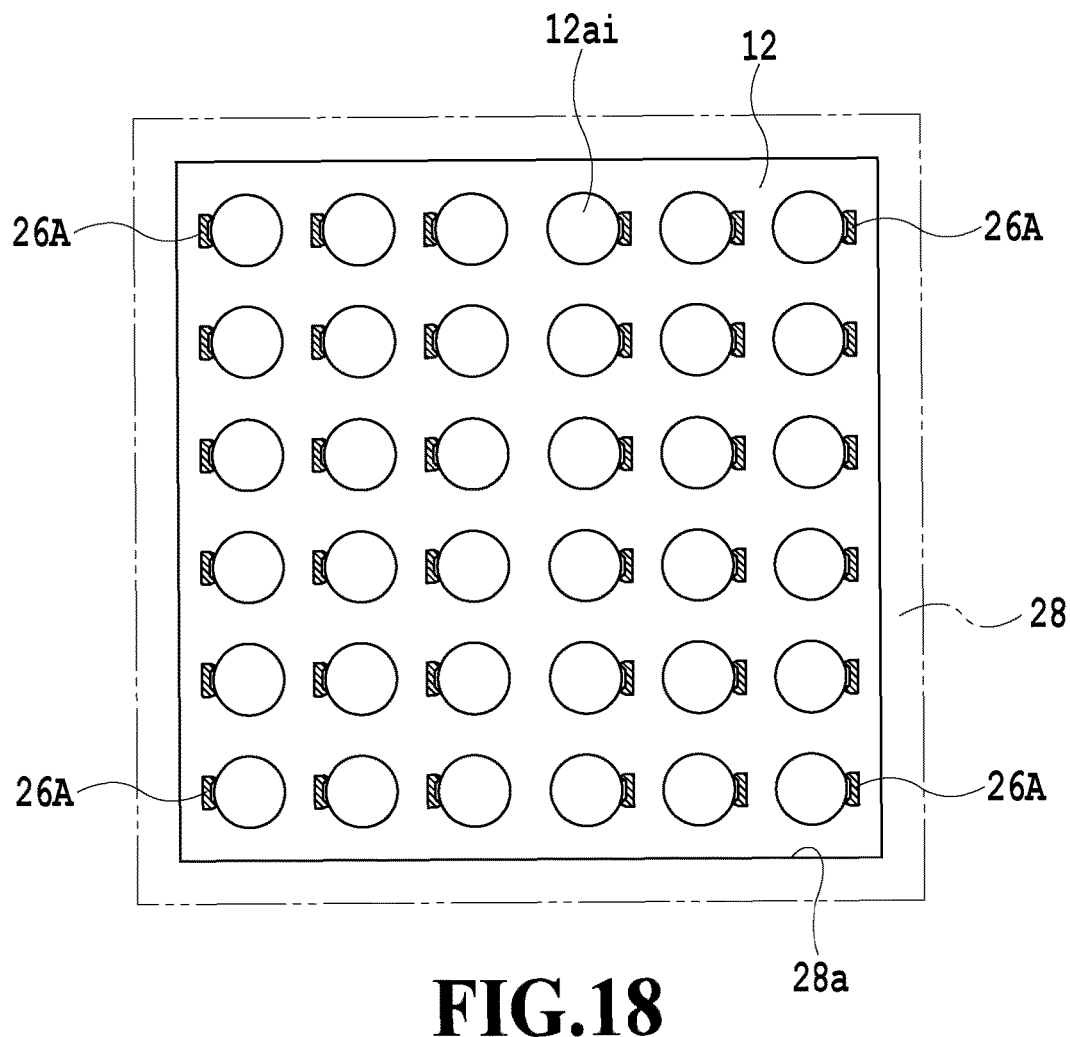
FIG. 18 is a view taken along XVIII-XVIII line in FIG. 17 and viewed in a direction of arrows attached thereto.

Although detailed illustration is omitted, the semiconductor device socket includes: a socket body provided with a housing which detachably accommodates the semiconductor device 12; a contact terminal group CG which electrically connects the respective bumps (the electrode portions) 12ai of the attached semiconductor device 12 to corresponding electrode portions of a printed wiring board; and a cover member (not shown) that is provided above the socket body in a vertically movable manner, and is configured to cause contact point portions of movable pieces 26A of contact terminals 26ai to be described later, which constitute the contact terminal group CG, selectively to come into contact with or move away from the respective bumps (the electrode portions) 12ai of the semiconductor device 12. As shown in FIG. 18, the semiconductor device 12 is assumed to be a semiconductor device of a substantially square shape adopting a package of either the BGA type or the FBGA type, for example. The semiconductor device 12 has even-numbered rows and even-numbered columns of the plurality of bumps 12ai (i=1 to n, n is a positive integer) serving as the electrode portions having a substantially semispherical shape, which are arranged in a matrix at predetermined intervals on a lower surface of the semiconductor device 12, for example.

As shown in FIG. 17, the socket body is provided with a positioning member 28 having a substantially square shape. A housing 28A to accommodate the semiconductor device 12 subjected to a test is provided at the center of the positioning member 28. Openings into which the movable pieces 26A of the plurality of contact terminals 26ai are inserted are formed in a bottom wall of the housing 28A constituting a bottom part thereof.

A slider 30 serving as a movable piece actuation member is provided at a position of the socket body immediately below the positioning member 28. The slider 30 is made vertically movable in directions indicated with arrows in FIG. 17. Note that in FIG. 17, an arrow U indicates the direction of upward movement of the slider 30 while an arrow D indicates the direction of downward movement of the slider 30. FIG. 17 illustrates the slider 30 moved to the uppermost position. The slider 30 is made movable through lever members (not shown) and in conjunction with vertical movement of the cover member such that the contact point part of the movable piece 26A of each contact terminal 26ai is selectively caused to come close to or move away from the corresponding bump 12ai. The slider 30 is moved through either a link mechanism including the lever members and being provided to the socket body or a cam mechanism formed on the cover member. The slider 30 has a plurality of elongated holes corresponding to the respective bumps of the attached semiconductor device 12 mentioned above. The adjacent elongated holes arrayed in the same row are partitioned by partition walls 30ai (i=1 to n, n is a positive integer) provided along the array direction. Moreover, on one wall surface of each of the adjacent partition walls 30ai defining the elongated holes is provided with a pressing portion, which presses and moves the corresponding movable piece 26A of the contact terminal in a direction orthogonal to the direction of movement of the slider 30 along with the vertical movement of the slider 30. The position of each of the pressing portions of the slider 30 corresponds to a position immediately below one spherical surface (a first surface) 12as1 of each semispherical bump 12ai of the attached semiconductor device 12 or to a position immediately below another spherical surface (a second surface) 12as2 thereof. The movable pieces 26A of the contact terminals 26ai are movably arranged in the elongated holes while being opposed to the above-mentioned pressing portions. Accordingly, the contact point portion of each movable piece 26A to be described later projects from the inside of the elongated hole toward the corresponding bump 12ai through an opening 28a of the positioning member 28 located above. When the pressing portions of the slider 30 are moved in the direction indicated with the arrow D, each of the contact point parts of the movable pieces 26A is caused to move away from the one spherical surface (the first surface) 12as1 or the other spherical surface (the second surface) 12as2 of the corresponding bump 12ai. On the other hand, when the pressing portions of the slider 30 are moved in the direction indicated with the arrow D, each of the contact point parts of the movable pieces 26A is caused to come close to the one spherical surface (the first surface) 12as1 or the other spherical surface (the second surface) 12as2 of the corresponding bump 12ai.

In the example shown in FIG. 4A, each contact terminal 16ai has the pair of movable pieces 16A and 16B. Instead, in the example shown in FIG. 17, each contact terminal 26ai (i=1 to n, n is a positive integer) is provided with a single movable piece 26A. Each contact terminal 26ai is made of a thin metal plate material, and comprises: a fixation part (not shown) provided with a nib part to be press-fitted into the corresponding opening in the socket body mentioned above; a soldering terminal part (not shown) extending to one end side of the fixation part; and the movable piece 26A extending to the other end side of the fixation part.

The elastically displaceable movable piece 26A of each contact terminal 26ai has a contact point part, which is located at its tip end and selectively comes into contact with the first surface 12as1 or the second surface 12as2 mentioned above. As with the example shown in the enlarged view of FIG. 5C mentioned above, for instance, such a contact point portion 26a has a first touch portion and a second touch portion being located on one surface and extending parallel to each other by a predetermined length along the corresponding long sides; and a fixing portion connecting one end of the first touch portion to one end of the second touch portion. Here, the touch portions and the fixing portion are arranged in an inverted U-shape.

In the above-described configuration, when the cover member is moved down to the predetermined lowermost end position against the biasing force of the coil springs therein, the slider 30 and the pressing portions thereof are moved in the direction indicated with the arrow D through either the link mechanism or the cam mechanism mentioned above. Thus, the movable piece 26A of each contact terminal is caused to move away from the corresponding bump 12ai. Next, after the semiconductor device 12 is placed in the housing 28A of the positioning member 28 and when the cover member is released from the pressure applied thereto, the cover member is moved up from the lowermost end position to the uppermost end position by the biasing force of the above-mentioned coil springs. Accordingly, the slider 30 and the pressing portions are moved in the direction indicated with the arrow U by resilience of the contact terminals and a biasing force of a not-illustrated biasing member. Thus, the movable piece 26A of each contact terminal 26ai is caused to come close to the corresponding bump 12ai again. As a consequence, each bump 12ai of the semiconductor device 12 attached to the housing 28A is electrically connected to the corresponding contact terminal 26ai.

On the other hand, when the semiconductor device 12 is detached from the housing 28A of the positioning member 28, the above-mentioned pressing operation on the cover member is performed against the biasing force of the coil springs therein. Thus, the slider 30 and the pressing portions are moved as in the above-described case.

Moreover, when the first touch portion and the second touch portion of the contact point part 26a of the movable piece 26A bite into and pinch the spherical surface of the corresponding bump 12ai of the semiconductor device 12, the bump 12ai may be moved up if the electrode surface of the semiconductor device 12 is warped upward or if the electrode surface is moved up and down due to vibration attributed to an impact on the IC socket during the burn-in test. In such cases, the inclined surface of the fixing portion of the movable piece 26A fixes the spherical surface of the bump 12ai. Hereby, the bump 12ai of the semiconductor device 12 is prevented from coming off the corresponding movable piece 26A.

Figure 19:
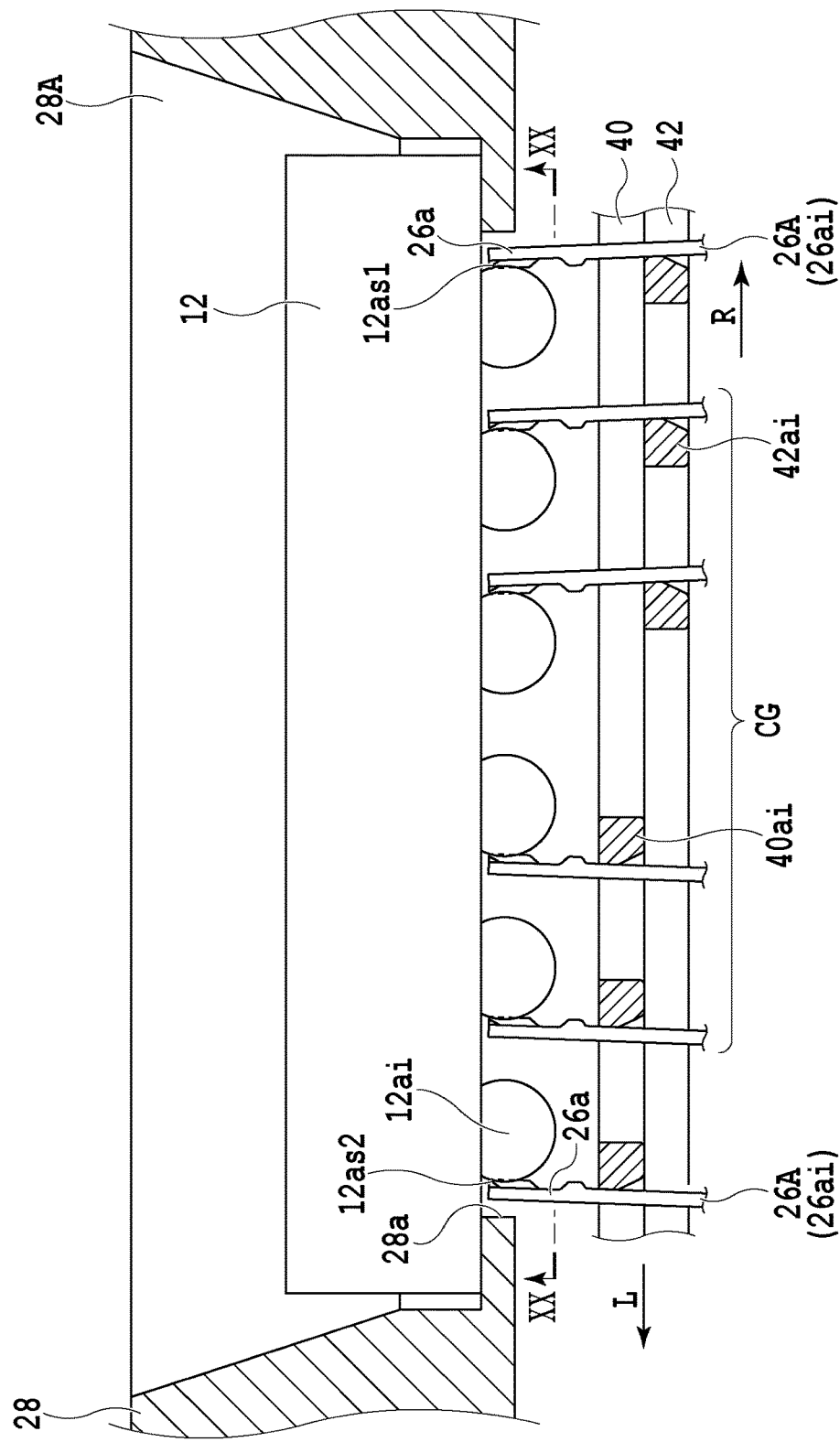
FIG. 19 is a partial enlarged cross-sectional view which shows a main part of still another example of the semiconductor device socket applying the fifth embodiment of the contact terminal according to the present invention.

FIG. 19 shows a main part of another example of an IC socket applying the above-described the fifth embodiment of contact terminal according to the present invention. Although detailed illustration is omitted, this semiconductor device socket comprises: the socket body provided with the housing which detachably accommodates the semiconductor device 12; the contact terminal group CG which electrically connects the respective bumps (the electrode portions) 12ai of the attached semiconductor device 12 to the corresponding electrode portions of the printed wiring board; and the cover member (not shown) that is provided above the socket body in a vertically movable manner, and is configured to cause the contact point parts of the movable pieces 26A of the contact terminals 26ai to be described later, which constitute the contact terminal group CG, selectively to come into contact with or move away from the respective bumps (the electrode portions) 12ai of the semiconductor device 12. Note that constituents in FIGS. 19 and 20 which are the same as the constituents in the example shown in FIG. 17 are denoted by the same reference numerals and overlapping explanations thereof will be omitted.

A slider 40 and a slider 42 (hereinafter also referred to as a first slider 40 and a second slider 42) each serving as a movable piece actuation member are provided at positions of the socket body immediately below the positioning member 28, in such a way as to be reciprocable along an arrow L and an arrow R in FIG. 19, respectively. Note that the arrow L indicates a direction of movement of the slider 40 to the left while the arrow R indicates a direction of movement of the slider 42 to the right. FIG. 19 illustrates initial positions of the sliders 40 and 42.

Each of the sliders 40 and 42 is made movable through lever members (not shown) and in conjunction with the vertical movement of the cover member such that the contact point part of the movable piece 26A of each contact terminal 26ai is selectively caused to come close to or move away from the corresponding bump 12ai. The sliders 40 and 42 are disposed in a vertically overlapping manner, and are moved through either a link mechanism including the lever members and being provided to the socket body or a cam mechanism (not shown) formed on the cover member.

The slider 40 has a plurality of elongated holes corresponding to the respective bumps of the attached semiconductor device 12 mentioned above. The adjacent elongated holes arrayed in the same row are partitioned by partition walls 40$ai$ (i=1 to n, n is a positive integer) provided along the array direction. Moreover, on one wall surface of each of the adjacent partition walls 40$ai$ defining the elongated holes, there is provided a pressing portion which presses and moves the corresponding movable piece 26A of the contact terminal in the direction of movement of the slider 40 along with the reciprocation of the slider 40. The position of each of the pressing portions of the slider 40 corresponds to the position immediately below the other spherical surface (the second surface) 12$as$2 of each semispherical bump 12$ai$ of the attached semiconductor device 12. The movable pieces 26A of the contact terminals 26$ai$ are movably arranged in the elongated holes while being opposed to the above-mentioned pressing portions.

The slider 42 has a plurality of elongated holes corresponding to the respective bumps of the attached semiconductor device 12 mentioned above. The adjacent elongated holes arrayed in the same row are partitioned by partition walls 42$ai$ (i=1 to n, n is a positive integer) provided along the array direction. Moreover, on one wall surface of each of the adjacent partition walls 42$ai$ defining the elongated holes, there is provided a pressing portion which presses and moves the corresponding movable piece 26A of the contact terminal in the direction of movement of the slider 42 along with the reciprocation of the slider 42. The position of each of the pressing portions of the slider 42 corresponds to the position immediately below the one spherical surface (the first surface) 12$as$1 of each semispherical bump 12$ai$ of the attached semiconductor device 12. The movable pieces 26A of the contact terminals 26$ai$ are movably arranged in the elongated holes while being opposed to the above-mentioned pressing portions.

Accordingly, the contact point portion of each movable piece 26A to be described later projects from the inside of the elongated hole toward the corresponding bump 12$ai$ through the opening 28a of the positioning member 28 located above. When the pressing portions of the slider 40 are moved in the direction of the arrow L and the pressing portions of the slider 42 are moved in the direction of the arrow R, each of the contact point parts of the movable pieces 26A is caused to move away from the one spherical surface (the first surface) 12$as$1 or the other spherical surface (the second surface) 12$as$2 of the corresponding bump 12$ai$. On the other hand, when the pressing portions of the slider 40 are moved in the opposite direction to the direction of the arrow L and the pressing portions of the slider 42 are moved in the opposite direction to the direction of the arrow R, each of the contact point portions of the movable pieces 26A is caused to come close to the one spherical surface (the first surface) 12$as$1 or the other spherical surface (the second surface) 12$as$2 of the corresponding bump 12$ai$ as shown in FIG. 20.

In the above-described configuration as well, when the first touch portion and the second touch portion of the contact point part 26a of the movable piece 26A bite into and pinch the spherical surface of the corresponding bump 12$ai$ of the semiconductor device 12, the bump 12$ai$ may be moved up if the electrode surface of the semiconductor device 12 is warped upward or if the electrode surface is moved up and down due to vibration attributed to an impact on the IC socket during the burn-in test. In such cases, the inclined surface of the fixing portion of the movable piece 26A fixes the spherical surface of the bump 12$ai$. In this way, the bump 12$ai$ of the semiconductor device 12 is prevented from coming off the corresponding movable piece 26A.

Figure 20:
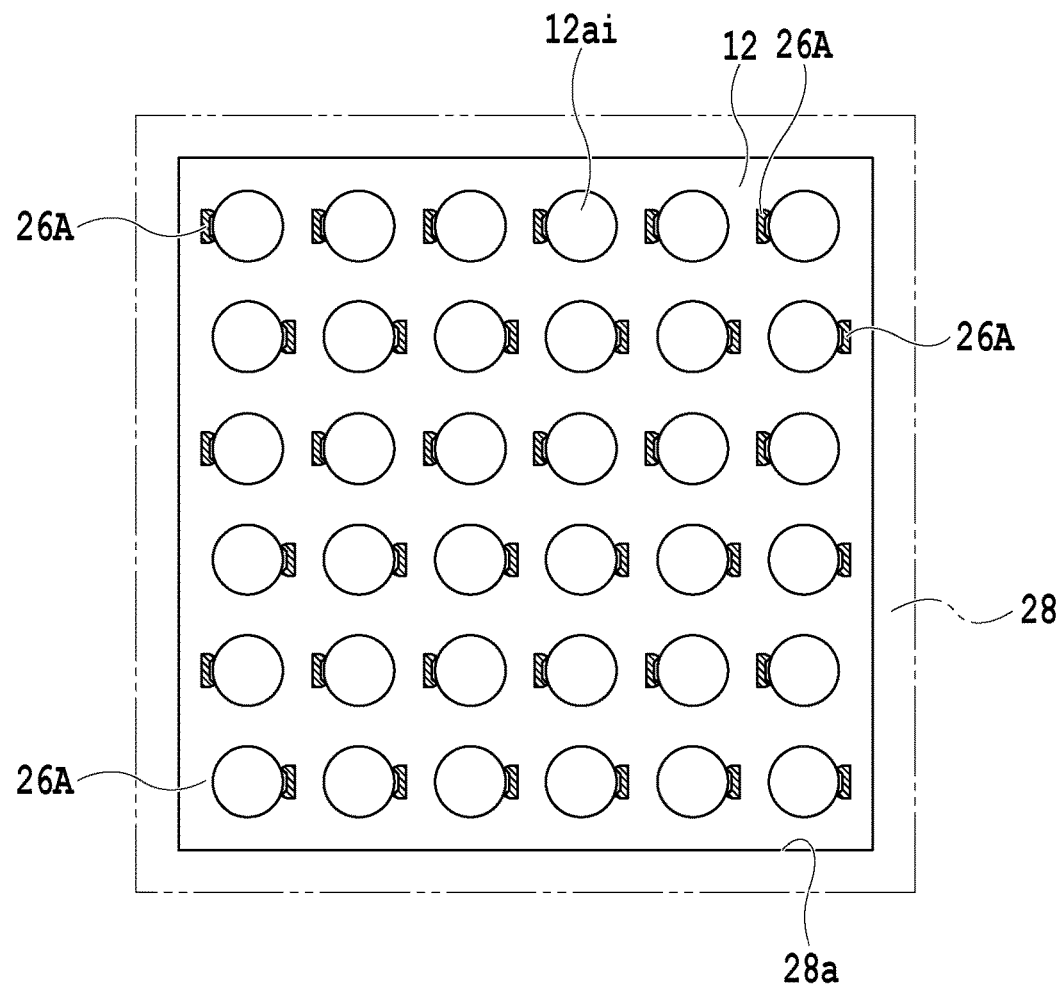
FIG. 20 is a view taken along XX-XX line in FIG. 19 and viewed in a direction of arrows attached thereto.
Figure 21:
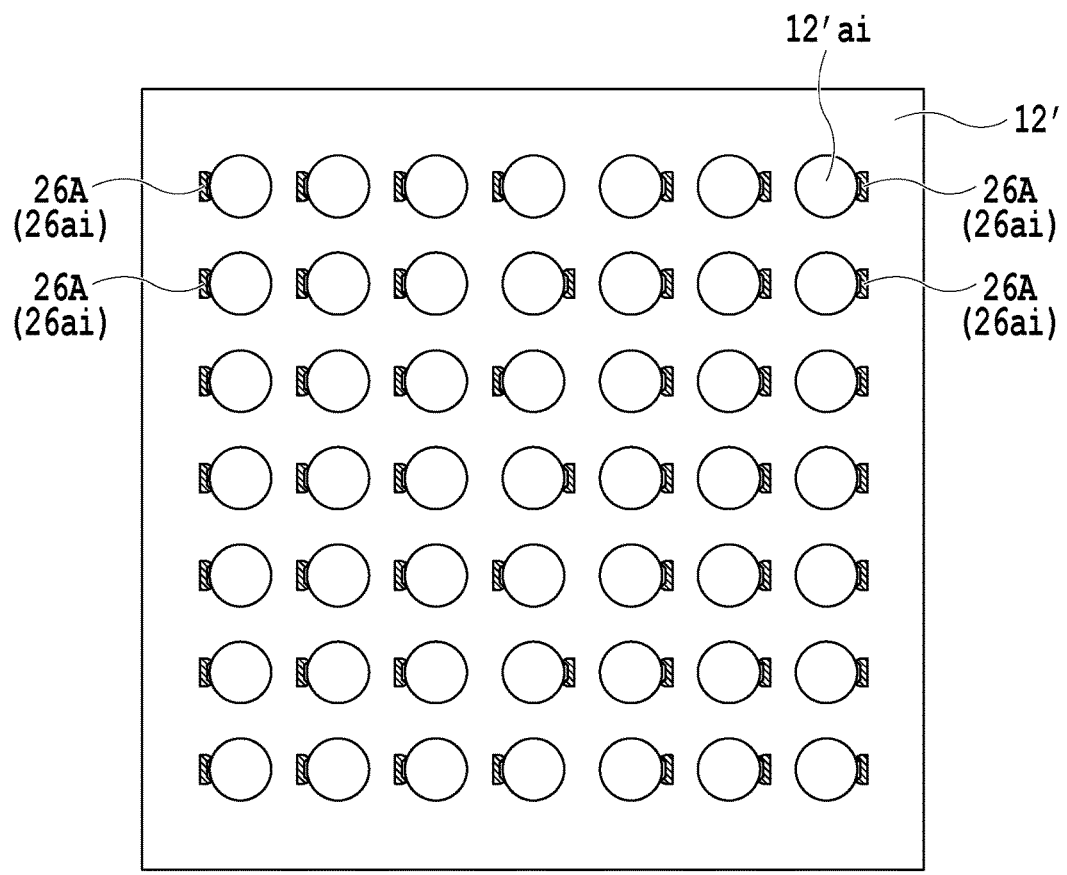
FIG. 21 is a plan view showing another example of the semiconductor device to be attached to an example of the IC socket according to the present invention, together with the contact terminals thereof.

Note that in the above-described example, the semiconductor device 12 has the bumps 12$ai$ (i=1 to n, n is a positive integer) of the substantially semispherical shape serving as the electrode portions, which are arranged in a matrix on the lower surface of the semiconductor device 12 in the form of the even-numbered rows and the even-numbered columns (6 pieces vertically by 6 pieces horizontally in FIG. 20). However, the present invention is not limited only to this configuration. For instance, as shown in FIG. 21, there may be provided a semiconductor device 12' including bumps 12'$ai$ (i=1 to n, n is a positive integer) of a substantially semispherical shape serving as electrode portions, which are arranged in a matrix on a lower surface of the semiconductor device 12' in the form of an odd-numbered rows and an odd-numbered columns (7 pieces vertically by 7 pieces horizontally in FIG. 21).

Figure 22A:
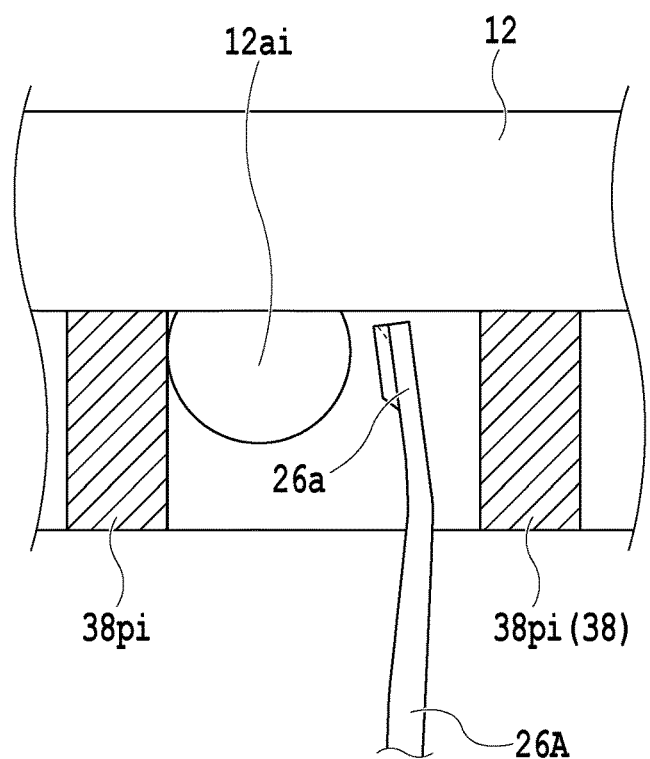
FIGS. 22A and 22B are partial cross-sectional views made available for explaining operations of another example of the IC socket according to the present invention, respectively.
Figure 22B:
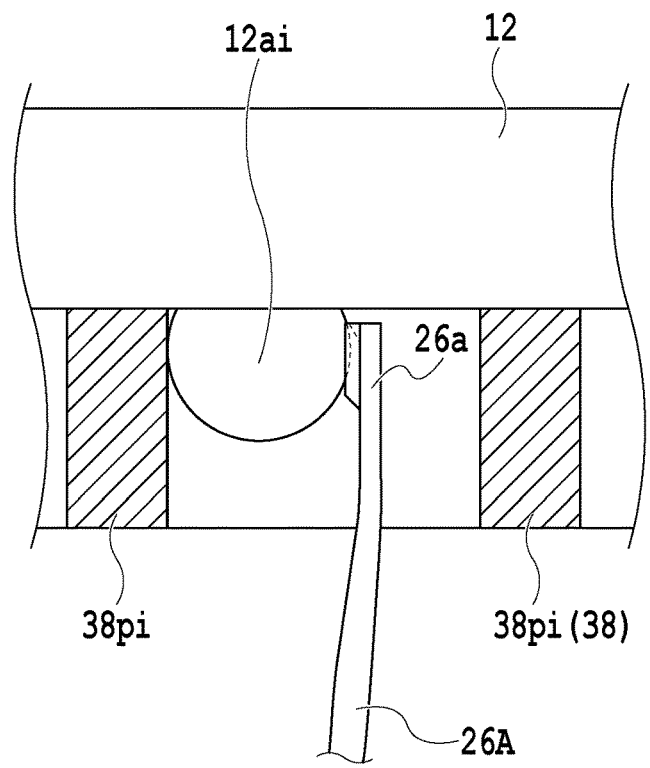

FIGS. 22A and 22B show a main part of still another example of the semiconductor device socket applying the above-described the fifth embodiment of contact terminal according to the present invention.

In the example shown in FIGS. 22A and 22B, each bump 12$ai$ of the attached semiconductor device 12 is held by being pinched between a wall surface of a partition wall 38Pi (i=1 to n, n is a positive integer) of an alignment plate 38 and the contact point part 26a of the movable piece 26A of the contact terminal 26$ai$.

Although detailed illustration is omitted, the semiconductor device socket comprises: a socket body provided with a housing which detachably accommodates the semiconductor device 12; a contact terminal group which electrically connects the respective bumps (the electrode portions) 12$ai$ of the attached semiconductor device 12 to corresponding electrode portions of a printed wiring board; and a cover member (not shown) that is provided above the socket body in a vertically movable manner, and is configured to cause contact point parts of movable pieces 26A of contact terminals 26$ai$ to be described later, which constitute the contact terminal group, selectively to come into contact with or move away from the respective bumps (the electrode portions) 12$ai$ of the semiconductor device 12. The socket body is provided with a positioning member having a substantially square shape and being provided with an accommodating portion, which is located at the center of the positioning member and configured to accommodate the semiconductor device 12 subjected to a test. The alignment plate 38 is provided on a bottom wall constituting a bottom part of the housing of the positioning member. As shown in FIG. 22A, the alignment plate 38 has a plurality of elongated holes into which the movable pieces 26A of the contact terminals 26$ai$ and the bumps 12$ai$ are inserted, respectively. The adjacent arrays of elongated holes are partitioned by division walls. The elongated holes on the same row are partitioned by the partition walls 38Pi formed opposite to one another. A slider (not shown) serving as a movable piece actuation member is reciprocably provided at a position of the socket body immediately below the positioning member in the socket body. When the slider is moved in one direction, the contact point part 26a of the movable piece 26A is caused to move away from one spherical surface of the corresponding bump 12$ai$ as shown in FIG. 22A. On the other hand, when the slider is moved in the other direction, the contact point part 26a of the movable piece 26A is caused to come close to the one spherical surface of the corresponding bump 12*ai* as shown in FIG. 22B. Thus, each bump 12*ai* is pinched by the contact point part 26*a* of the movable piece 26A and the wall surface of the partition wall 38Pi.

It is to be noted that the embodiments of the contact terminal according to the present invention are not limited only to the above-described examples. For instance, the contact terminal may have: the contact point portion shown in FIG. 9A or the contact point portion shown in FIG. 13A; and the contact point part shown in FIG. 15B. Moreover, the contact terminal may have: the contact point portion shown in FIG. 15B; and the contact point portion shown in FIG. 11B or the contact point portion shown in FIG. 14A, for example. Moreover, the contact terminal may have: the contact point portion shown in FIG. 16; and the contact point portion shown in FIG. 11B or the contact point portion shown in FIG. 13A, for example. Furthermore, the contact terminal may be configured such that at least one of the movable pieces includes the fixing portion of any of the contact point portions applied to the above-described embodiments, and that the other movable piece has the touch portion of any of the contact point portions applied to the above-described embodiments. Moreover, it is needless to say that any combinations of the contact point portions are available.

In one example of the IC socket according to the present invention, the slider serving as the movable piece actuation member is designed to be moved substantially parallel to the surface of the printed wiring board PB, thereby moving one of the pair of movable pieces. However, the present invention is not limited to this example. For instance, such a movable piece actuation member may be designed to be moved substantially in a perpendicular direction to the surface of the printed wiring board PB, thereby causing both of the pair of movable pieces to move away from or come close to each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A contact terminal comprising:
   at least one movable piece selectively coming into contact with a spherical electrode portion in a semiconductor device; and
   a terminal portion coupled to a proximal end portion of the movable piece, wherein
   a contact point portion of the movable piece includes
      at least one touch portion extending along a longitudinal direction of the movable piece, and coming into contact with the spherical electrode portion, and
      a fixing portion intersecting a tip end of the touch portion and being connected to the tip end of the touch portion, and having an inclined surface portion to fix the spherical electrode portion,
   a ridge line of the touch portion projecting farther outwardly than a ridge line of the fixing portion.

2. The contact terminal according to claim 1, comprising a pair of the movable pieces, wherein
   a contact point portion of one of the pair of the movable pieces includes
      at least one touch portion extending along a longitudinal direction of the one movable piece, and coming into contact with the spherical electrode portion, and
      a fixing portion intersecting a tip end of the touch portion, and having an inclined surface portion to fix the spherical electrode portion, and
   a contact point portion of the other one of the pair of the movable pieces includes
      at least one touch portion extending along a longitudinal direction of the other movable piece, and coming into contact with the spherical electrode portion, and
      a fixing portion intersecting a tip end of the touch portion, and having an inclined surface portion to fix the spherical electrode portion.

3. The contact terminal according to claim 1, comprising a pair of the movable pieces, wherein
   a contact point portion of one of the pair of the movable pieces includes
      a pair of touch portions extending in such a way as to be opposed to each other at a predetermined interval and along a longitudinal direction of the one movable piece, and coming into contact with the spherical electrode portion, and
      a fixing portion intersecting a tip end of each touch portion, and having an inclined surface portion to fix the spherical electrode portion, and
   a contact point portion of the other one of the pair of the movable pieces includes
      a pair of touch portions extending in such a way as to be opposed to each other at a predetermined interval and along a longitudinal direction of the other movable piece, and coming into contact with the spherical electrode portion, and
      a fixing portion intersecting a tip end of each touch portion, and having an inclined surface portion to fix the spherical electrode portion.

4. The contact terminal according to claim 1, comprising a pair of the movable pieces, wherein
   a contact point portion of one of the pair of the movable pieces includes
      a pair of touch portions extending in such a way as to be opposed to each other at a predetermined interval and along a longitudinal direction of the one movable piece, and coming into contact with the spherical electrode portion, and
   a contact point portion of the other one of the pair of the movable pieces includes
      a pair of touch portions extending in such a way as to be opposed to each other at a predetermined interval and along a longitudinal direction of the other movable piece, and coming into contact with the spherical electrode portion, and
      a fixing portion intersecting a tip end of the each touch portion, and having an inclined surface portion to fix the spherical electrode portion.

5. The contact terminal according to claim 1, comprising a pair of the movable pieces, wherein
   a contact point portion of one of the pair of the movable pieces includes
      at least one touch portion extending along a longitudinal direction of the one movable piece, and coming into contact with the spherical electrode portion, and
   a contact point portion of the other one of the pair of the movable pieces includes
      a pair of touch portions extending in such a way as to be opposed to each other at a predetermined interval and along a longitudinal direction of the other movable piece, and coming into contact with the spherical electrode portion, and a fixing portion intersecting a tip end of each touch portion, and having an inclined surface portion to fix the spherical electrode portion.

6. The contact terminal according to claim 1, comprising a pair of the movable pieces, wherein a contact point portion of one of the pair of the movable pieces includes at least one touch portion extending along a longitudinal direction of the one movable piece, and coming into contact with the spherical electrode portion, and two fixing portions intersecting a tip end of each touch portion, each fixing portion having an inclined surface portion to fix the spherical electrode portion, and a contact point portion of the other one of the pair of the movable pieces includes at least one touch portion extending along a longitudinal direction of the other movable piece, and coming into contact with the spherical electrode portion, and two fixing portions intersecting a tip end of each touch portion, each fixing portion having an inclined surface portion to fix the spherical electrode portion.

7. An IC socket comprising:

a socket body including the contact terminal according to claim 1;

a semiconductor device placement portion on which a semiconductor device having a spherical electrode portion is detachably placed, the semiconductor device placement portion being provided in the socket body; and a movable piece drive mechanism portion movably provided in the socket body, and configured to actuate at least one of a pair of movable pieces of the contact terminal in such a way as to approach or move away from the spherical electrode portion.

* * * * *